United States Patent
Song

(10) Patent No.: US 9,136,264 B2
(45) Date of Patent: Sep. 15, 2015

(54) MOS TRANSISTORS HAVING LOW OFFSET VALUES, ELECTRONIC DEVICES INCLUDING THE SAME, AND METHODS OF FABRICATING THE SAME

(71) Applicant: SK HYNIX INC., Icheon (KR)

(72) Inventor: Hyun Min Song, Cheongju (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 14/253,493

(22) Filed: Apr. 15, 2014

(65) Prior Publication Data
US 2015/0171809 A1 Jun. 18, 2015

(30) Foreign Application Priority Data
Dec. 17, 2013 (KR) .................. 10-2013-0157027

(51) Int. Cl.
| | |
|---|---|
| H01L 27/088 | (2006.01) |
| H01L 29/423 | (2006.01) |
| H01L 29/06 | (2006.01) |
| H03F 3/45 | (2006.01) |
| H01L 21/8234 | (2006.01) |
| H01L 29/786 | (2006.01) |
| H01L 21/761 | (2006.01) |

(52) U.S. Cl.
CPC .......... *H01L 27/088* (2013.01); *H01L 29/4238* (2013.01); *H01L 29/42376* (2013.01); *H01L 21/761* (2013.01); *H01L 21/823437* (2013.01); *H01L 29/0653* (2013.01); *H01L 29/78609* (2013.01); *H01L 29/78696* (2013.01); *H03F 2003/45008* (2013.01); *H03F 2203/45212* (2013.01); *H03F 2203/45344* (2013.01)

(58) Field of Classification Search
CPC ..... H01L 21/336; H01L 29/78; H01L 21/265; H01L 29/1045
See application file for complete search history.

(56) References Cited

U.S. PATENT DOCUMENTS

| | | | | |
|---|---|---|---|---|
| 4,084,175 | A * | 4/1978 | Ouyang | 257/336 |
| 5,783,469 | A * | 7/1998 | Gardner et al. | 438/199 |
| 2001/0028089 | A1* | 10/2001 | Adan | 257/347 |
| 2014/0103440 | A1* | 4/2014 | Chatterjee | 257/368 |

FOREIGN PATENT DOCUMENTS

KR 10-2009-0099870 A 9/2009

* cited by examiner

*Primary Examiner* — Matthew Reames
*Assistant Examiner* — Vincent Wall

(57) ABSTRACT

A MOS transistor includes a gate electrode disposed over an active region without overlapping with an isolation region, the active region including a channel region, the isolation region defining the active region, a source region and a drain region disposed in first and second portions of the active region, respectively, the first and second portions being disposed at first and second sides of the gate electrode, respectively, the first side opposing the second side, a first blocking region disposed in a third portion of the active region between a third side of the gate electrode and the isolation region and between the source and the drain region, and a second blocking region disposed in a fourth portion of the active region between a fourth side of the gate electrode and the isolation region and between the source and the drain region, the fourth side opposing the third side.

15 Claims, 10 Drawing Sheets

MOS TRANSISTORS HAVING LOW OFFSET VALUES, ELECTRONIC DEVICES INCLUDING THE SAME, AND METHODS OF FABRICATING THE SAME

CROSS-REFERENCE TO RELATED APPLICATION

The present application claims priority under 35 U.S.C 119(a) to Korean Patent Application No. 10-2013-0157027, filed on Dec. 17, 2013, in the Korean Intellectual Property Office, which is incorporated herein by reference in its entirety as set forth in full.

BACKGROUND

1. Technical Field

Embodiments of the present disclosure relate to semiconductor devices and methods of fabricating the same, and more particularly, to MOS transistors having low offset values, electronic devices including the same, and methods of fabricating the same.

2. Related Art

Electronic devices such as memory devices and logic devices may include metal-oxide-semiconductor field effect transistors (MOSFETs, also referred to as MOS transistors). The memory devices may include dynamic random access memory (DRAM) devices and static random access memory (SRAM) devices, and the logic devices may include processors such as central processing units (CPUs). The MOS transistors included in the electronic devices may constitute various circuits, and functions of the electronic devices may be determined according to configurations of the circuits including the MOS transistors. Thus, characteristics of the MOS transistors may influence the functions of the electronic devices.

In particular, when a plurality of MOS transistors are integrated in a semiconductor substrate (or semiconductor wafer) to constitute electronic devices, electrical and physical parameters of the MOS transistors may be non-uniform according to where the MOS transistors are implemented in the semiconductor substrate due to non-uniformity of fabrication processes or due to physical phenomena occurring while the MOS transistors operate. Thus, some of the electronic devices fabricated in the semiconductor substrate may malfunction and thus decrease a process yield. For example, in case of an operational amplifier (OP-AMP), two input MOS transistors constituting the OP-AMP may be fabricated to have different parameters. In such a case, the OP-AMP may exhibit an offset voltage of about several milli-voltages. A chopping technique has been widely used to remove such an offset voltage. However, in such a case, a plurality of MOS transistors has to be additionally disposed in the OP-AMP to constitute a chopping circuit. As a result, the chopping technique may lead to degradation of the integration density of the OP-AMP.

The offset voltage of the OP-AMP may be caused by the non-uniform parameters (i.e., offset values) of the MOS transistors constituting the OP-AMP. One of major parameters affecting the offset values of the MOS transistors may be a threshold voltage or a transconductance. Ideally, all of MOS transistors constituting an electronic device such as the OP-AMP have to be formed to have the same threshold voltage. However, the MOS transistors constituting the electronic device may be formed in a semiconductor substrate to have non-uniform threshold voltages due to the non-uniformity of fabrication processes and geometric shapes of the MOS transistors. For example, threshold voltages of MOS transistors formed in a semiconductor substrate may be non-uniform because of a step difference between top surfaces of active layers in active regions and a top surface of an isolation layer in an isolation region. That is, the step difference between the active layers and the isolation layer may cause non-uniform electric fields. Accordingly, MOS transistors having gate electrodes disposed on interfacial regions between the active layers and the isolation layer may exhibit non-uniform threshold voltages. As a result, the MOS transistors having the non-uniform threshold voltages may have different characteristics.

SUMMARY

Various embodiments of the present disclosure are directed to MOS transistors having low offset values, electronic devices including the same, and methods of fabricating the same.

According to some embodiments, a MOS transistor includes a gate electrode disposed over an active region without overlapping with an isolation region, the active region including a channel region, the isolation region defining the active region, a source region and a drain region disposed in first and second portions of the active region, respectively, the first and second portions being disposed at first and second sides of the gate electrode, respectively, the first side opposing the second side, a first blocking region disposed in a third portion of the active region between a third side of the gate electrode and the isolation region and between the source region and the drain region, and a second blocking region disposed in a fourth portion of the active region between a fourth side of the gate electrode and the isolation region and between the source region and the drain region, the fourth side opposing the third side. The source region and the drain region have a first conductivity type and the first and second blocking regions have a second conductivity type opposite to the first conductivity type.

According to further embodiments, an electronic device includes a plurality of MOS transistors. At least one of the plurality of MOS transistors includes a gate electrode disposed over an active region without overlapping with an isolation region defining the active region, the active region including a channel region, a source region and a drain region disposed in first and second portions of the active region, respectively, the first and second portions being disposed at first and second sides of the gate electrode, respectively, the first side of the gate electrode opposing the second side of the gate electrode, a first blocking region disposed in a third portion of the active region between a third side of the gate electrode and the isolation region and between the source region and the drain region, and a second blocking region disposed in a fourth portion of the active region between a fourth side of the gate electrode and the isolation region and between the source region and the drain region, the fourth side of the gate electrode opposing the third side of the gate electrode. The source region and the drain region have a first conductivity type and the first and second blocking regions have a second conductivity type opposite to the first conductivity type.

According to further embodiments, an electronic device includes first and second MOS transistors for receiving first and second input signals and third and fourth MOS transistors for supplying current to the first and second MOS transistors. Each of the first and second MOS transistors includes a substrate having an isolation region and an active region, an isolation layer disposed in the isolation region to define the active region having a channel region, a gate electrode disposed on the active region without any overlap with the isolation region, a source region and a drain region disposed in portions of the substrate which are located at both sides of the gate electrode, a first blocking region disposed in the substrate between one end of the gate electrode and the isolation region adjacent thereto and between the source region and the drain region, and a second blocking region disposed in the substrate between the other end of the gate electrode and the isolation region adjacent thereto and between the source region and the drain region. The source region and the drain region have a first conductivity type and the first and second blocking regions have a second conductivity type opposite to the first conductivity type. According to further embodiments, a method of fabricating a MOS transistor includes forming an isolation layer in an isolation region to define an active region, forming a gate electrode over the active region so that the gate electrode does not overlap with the isolation region, forming a source region and a drain region in first and second portions of the active region which are located at first and second sides of the gate electrode, respectively, the first side of the gate electrode opposing the second side of the gate electrode, forming a first blocking region in a third portion of the active region between a third side of the gate electrode and the isolation region and between the source region and the drain region, forming a second blocking region in a fourth region of the active region between a fourth side of the gate electrode and the isolation region and between the source region and the drain region, the fourth side of the gate electrode opposing the third side of the gate electrode, and forming a first contact and a second contact over the first blocking region and the second blocking region, respectively. The source region and the drain region have a first conductivity type and the first and second blocking regions have a second conductivity type opposite to the first conductivity type.

BRIEF DESCRIPTION OF THE DRAWINGS

Embodiments of the present disclosure will become more apparent in view of the attached drawings and accompanying detailed description, in which.

DETAILED DESCRIPTION OF EMBODIMENTS

According to embodiments of the present disclosure, gate electrodes of MOS transistors may be disposed only on active regions without overlapping with an isolation layer surrounding the active regions. Thus, even though there may be a step difference between the active regions and the isolation layer, the step difference may not affect offset characteristics of the MOS transistors. These MOS transistors may be employed in dynamic random access memory (DRAM) devices, static random access memory (SRAM) devices, flash memory devices, magnetic random access memory (MRAM) devices, phase changeable random access memory (PcRAM) devices, resistive random access memory (ReRAM) devices, ferroelectric random access memory (FeRAM) devices, or the like.

In the present disclosure, it will be understood that when an element is referred to as being located "on", "over", "above", "under", "beneath" or "below" another element, it can be directly contact the other element, or at least one intervening element may be present therebetween. Accordingly, the terms such as "on", "over", "above", "under", "beneath", "below" and the like which are used herein are for the purpose of describing particular embodiments only and are not intended to limit the scope of the present disclosure.

Figure 1:
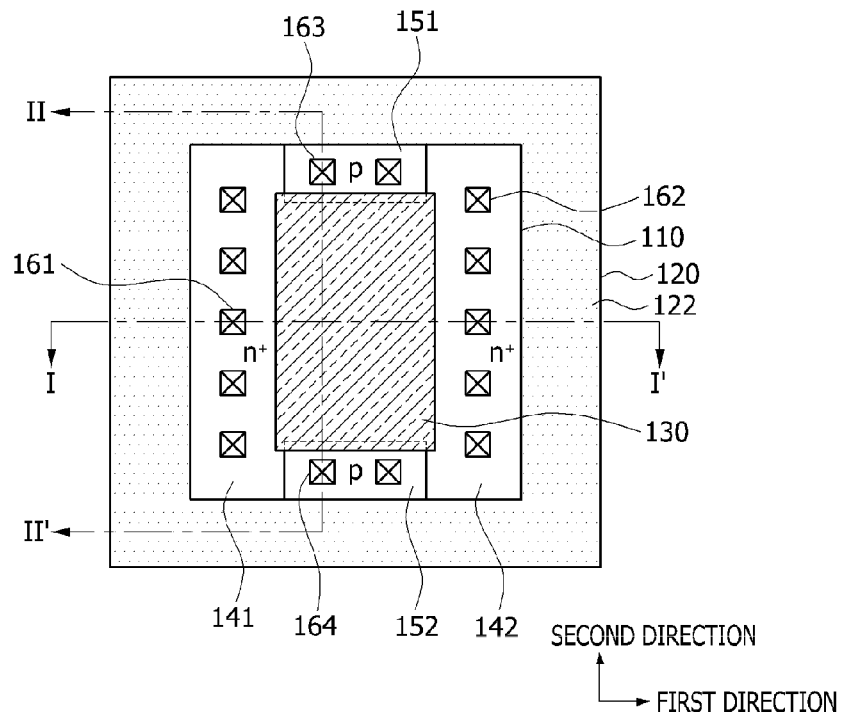
FIG. 1 is a layout diagram illustrating a MOS transistor according to an embodiment of the present disclosure.
Figure 2:
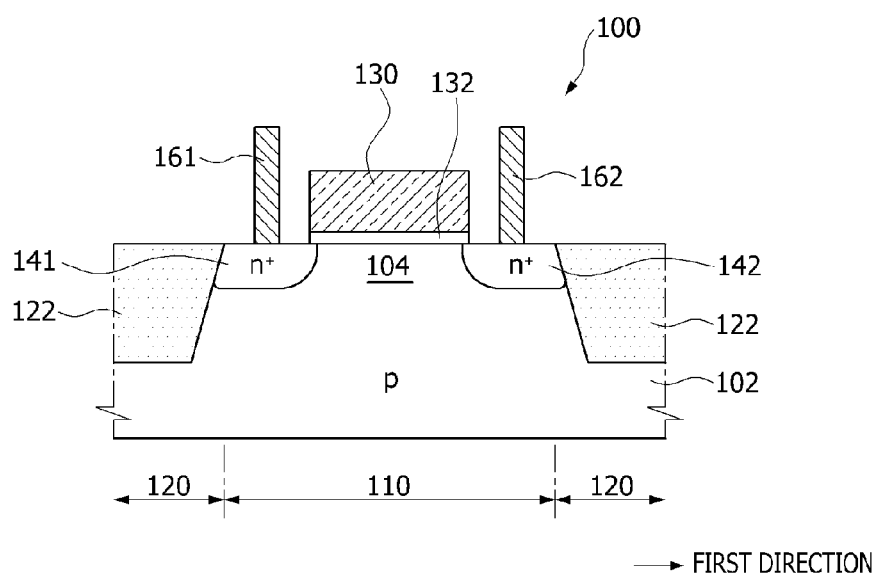
FIG. 2 illustrates a cross-sectional view taken along a line I-I' of FIG. 1 according to a first embodiment of the present disclosure.
Figure 3:
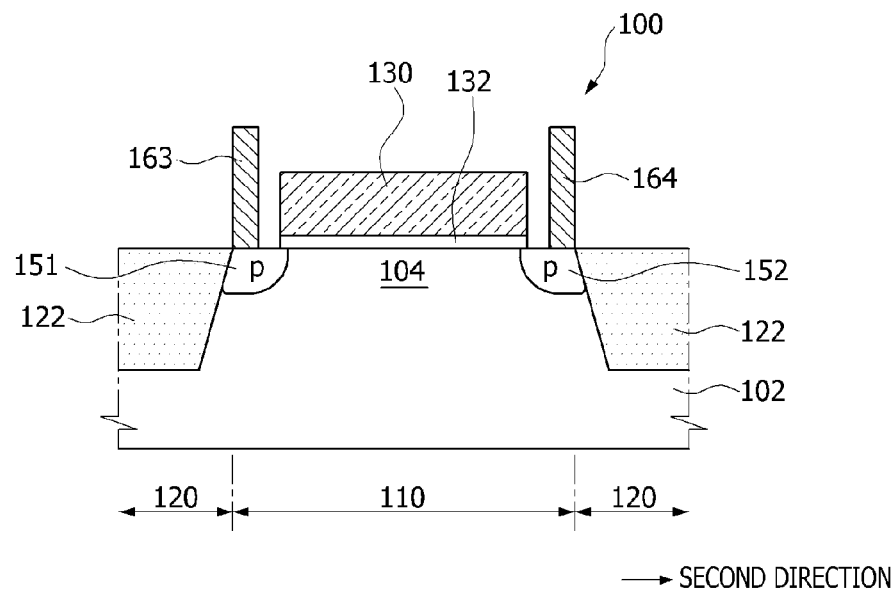
FIG. 3 illustrates a cross-sectional view taken along a line II-II' of FIG. 1.

Referring to FIGS. 1, 2, and 3, a MOS transistor 100 includes an isolation layer 122 disposed in an isolation region 120 of a semiconductor substrate 102 to define an active region 110. The isolation region 120 surrounds the active region 110. A MOS transistor according to an embodiment may be an N-channel MOS transistor. Thus, the semiconductor substrate 102 may be a P-type substrate. In another embodiment, the semiconductor substrate 102 including the N-channel MOS transistor may be an N-type substrate. In such a case, a P-type well region may be disposed in the semiconductor substrate 102 and the active region 110 may be defined in the P-type well region.

In another embodiment, the MOS transistor illustrated in FIG. 1 may be a P-channel MOS transistor. In such a case, the P-channel MOS transistor may have substantially the same configuration as the N-channel MOS transistor described above except that conductivity types of some elements thereof are opposite to those of the N-channel MOS transistor. That is, if the MOS transistor illustrated in FIG. 1 is a P-channel MOS transistor, the semiconductor substrate 102 may be an N-type substrate or a P-type substrate, and an N-type well region may be additionally disposed in the semiconductor substrate 102 if the semiconductor substrate 102 is the P-type substrate.

Although FIG. 1 illustrates an embodiment in which the active region 110 has a rectangular shape in a plan view, embodiments are not limited thereto. In another embodiment, the active region 110 has a different shape from the rectangular shape. The active region 110 may have a flat top surface which is parallel with a horizontal surface.

The isolation layer 122 may be an insulation layer filling a trench region which is disposed in the semiconductor substrate 102 to have a predetermined depth. That is, the isolation layer 122 may be a trench isolation layer. Although not shown in the drawings, a step difference, i.e., a difference in relative positions, may exist between a top surface of the active region 110 and a top surface of the isolation layer 122. When a plurality of MOS transistors are disposed in respective ones of a plurality of active regions 110 defined in the semiconductor substrate 102, top surfaces of the active regions 110 and the isolation layer 122 surrounding the active regions 110 may have different profiles from each other due to the non-uniformity of fabrication processes.

A gate insulation layer pattern 132 and a gate electrode 130 are sequentially stacked on the top surface of the active region 110. In an embodiment, the gate insulation layer pattern 132 includes an oxide layer. In another embodiment, the gate insulation layer pattern 132 includes an insulation layer different from an oxide layer. In an embodiment, the gate electrode 130 includes a doped polysilicon layer. In another embodiment, the gate electrode 130 includes a conductive layer different from the doped polysilicon layer.

The gate electrode 130 may be disposed only on a portion of the active region 110, without overlapping with the isolation layer 122. Although FIG. 1 illustrates an embodiment in which the gate electrode 130 has a rectangular shape in a plan view, embodiments are not limited thereto. In another embodiment, the gate electrode 130 may have a different shape from the rectangular shape. The gate electrode 130 may have a plate form which is parallel with the top surface of the active region 110.

A portion of the active region 110 that includes the surface that overlaps with the gate electrode 130 may correspond to a channel region 104. The channel region 104 may be inverted to have an opposite conductivity type to an original conductivity type thereof when a gate voltage higher than a threshold voltage is applied to the gate electrode 130. Thus, the inverted channel region 104 acts as a current path through which carriers (e.g., electrons) are drifted. In an embodiment, the gate electrode 130 has a width and a length which is greater than the width when viewed from a plan view, as in the layout diagram of FIG. 1. In such a case, a width direction of the gate electrode 130 may be parallel with a first direction and a length direction of the gate electrode 130 may be parallel with a second direction perpendicular to the first direction. The width of the gate electrode 130 in the first direction may correspond to a channel length of the MOS transistor and the length of the gate electrode 130 in the second direction may correspond to a channel width of the MOS transistor.

A drain region 141 heavily doped with N-type impurities is disposed in an upper portion of the active region 110 (see, e.g., FIG. 2). Viewing FIG. 1 from left to right, i.e., along the first direction, the drain region 141 is disposed between the isolation layer 122 and one end of the gate electrode 130. A source region 142 heavily doped with N-type impurities is disposed in an upper portion of the active region 110 (see, e.g., FIG. 2). Viewing FIG. 1 from left to right, i.e., along the first direction, the source region 142 is disposed between the other opposing end of the gate electrode 130 and the isolation layer 122.

A first blocking region 151 doped with P-type impurities is disposed in an upper portion of the active region 110 (see, e.g., FIG. 3). Viewing FIG. 1 from the bottom to the top of the figure, i.e., along the second direction, the first blocking region 151 is disposed between one end of the gate electrode 130 and the isolation layer 122 adjacent to the one end of the gate electrode 130. A second blocking region 152 doped with P-type impurities is disposed in an upper portion of the active region 110 (see, e.g., FIG. 3). Viewing FIG. 1 from the bottom to the top of the figure, i.e., along the second direction, the second blocking region 152 is disposed between isolation layer 122 adjacent to the other opposing end of the gate electrode 130 and the other end of the gate electrode 130.

The first and second blocking regions 151 and 152 may have the same conductivity type, e.g., a P-type, as that of the active region 110. Thus, a drain current can flow from the N-type drain region 141 toward the N-type source region 142 only through the inverted channel region 104 because both the first and second blocking regions 151 and 152 disposed between the N-type drain region 141 and the N-type source region 142 have the same conductivity type as that of the active region 110.

Drain electrodes 161 are disposed on the N-type drain region 141, and source electrodes 162 are disposed on the N-type source region 142. A drain voltage may be applied to the N-type drain region 141 through the drain electrodes 161, and a source voltage may be applied to the N-type source region 142 through the source electrodes 162. Each of the drain electrodes 161 and the source electrodes 162 may include a metal layer.

If the MOS transistor 100 operates when the first and second blocking regions 151 and 152 are electrically floated, leakage currents may flows between the N-type drain region 141 and the N-type source region 142 because electric potentials of the first and second blocking regions 151 and 152 are unstable. Thus, a certain bias voltage should be applied to the first and second blocking regions 151 and 152 in order that the MOS transistor 100 stably operates. In order to apply an appropriate bias voltage to the first and second blocking regions 151 and 152, first contacts 163 and second contacts 164 are disposed on the first blocking region 151 and the second blocking region 152, respectively. Each of the first and second contacts 163 and 164 may include a metal layer.

If the MOS transistor 100 is an N-channel MOS transistor, the bias voltage applied to the first and second blocking regions 151 and 152 through the first and second contacts 163 and 164 may be set to be lower than the source voltage applied to the N-type source region 142. That is, a reverse bias is applied to a P-N junction between each of the first and second blocking regions 151 and 152 and each of the drain and source regions 141 and 142. In another embodiment, the bias voltage applied to the first and second blocking regions 151 and 152 through the first and second contacts 163 and 164 may be set to be equal to the source voltage applied to the N-type source region 142.

Figure 4:
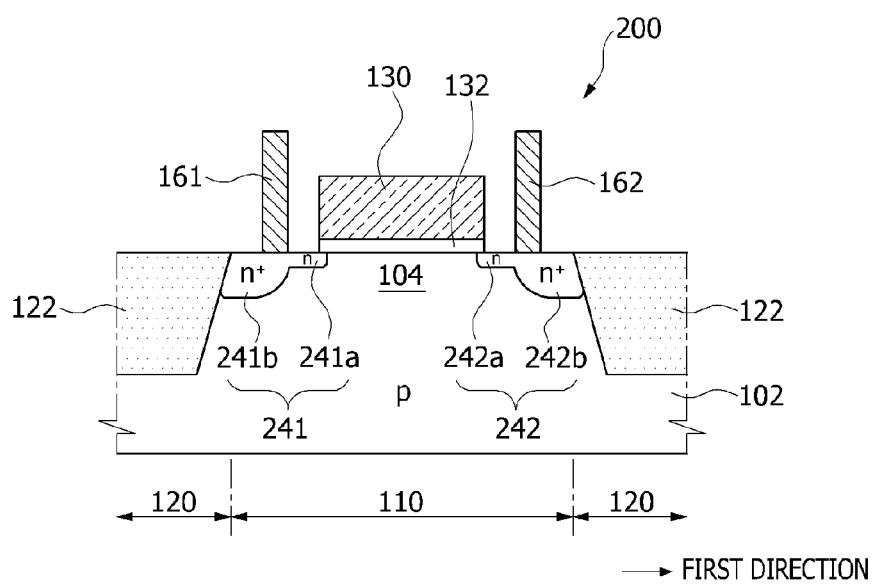
FIG. 4 illustrates a cross-sectional view taken along a line I-I' of FIG. 1 according to a second embodiment of the present disclosure.

FIG. 4 illustrates a cross-sectional view taken along a line I-I' of FIG. 1 according to another embodiment. In FIG. 4, the same reference numerals as used in FIGS. 1, 2 and 3 denote the same elements. In the present embodiment, a cross-sectional view taken along the line II-II' of FIG. 1 is identical to FIG. 3. Thus, to avoid duplicate explanation, descriptions of the same elements as set forth in the previous embodiment will be omitted or briefly mentioned in this embodiment.

Referring to FIG. 4, a MOS transistor 200 includes a drain region 241 doped with N-type impurities and a source region 242 doped with the N-type impurities. Each of the N-type drain region 241 and the N-type source region 242 has a lightly doped drain (LDD) structure. That is, the N-type drain region 241 includes a drain extension region 241a and a deep drain region 241b. The drain extension region 241a is lightly doped with the N-type impurities and has a relatively shallow depth, and the deep drain region 241b is heavily doped with the N-type impurities and has a relatively deep depth. Similarly, the N-type source region 242 includes a source extension region 242a and a deep source region 242b. The source extension region 242a is lightly doped with the N-type impurities and has a relatively shallow depth, and the deep source region 242b is heavily doped with the N-type impurities and has a relatively deep depth. The drain extension region 241a and the source extension region 242a contact the channel region 104. Although not shown in FIG. 4, gate spacers may be disposed on sidewalls of the gate electrode 130 to form the deep drain region 241b and the deep source region 242b that are to be spaced apart from the channel region 104.

Figure 5:
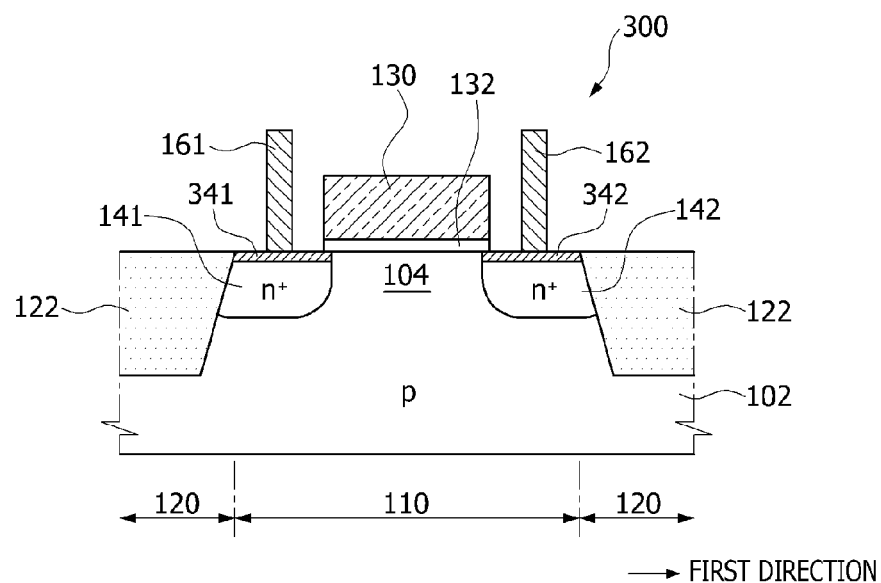
FIG. 5 illustrates a cross-sectional view taken along a line I-I' of FIG. 1 according to a third embodiment of the present disclosure.

FIG. 5 illustrates a cross-sectional view taken along the line I-I' of FIG. 1 according to still another embodiment. In FIG. 5, the same reference numerals as used in FIGS. 1, 2 and 3 denote the same elements. In the present embodiment, a cross-sectional view taken along the line II-II' of FIG. 1 is identical to FIG. 3. Thus, to avoid duplicate explanation, descriptions of the same elements as set forth in the previous embodiment illustrated in FIGS. 1, 2 and 3 will be omitted or briefly mentioned in this embodiment.

Referring to FIG. 5, a MOS transistor 300 includes a first metal silicide layer 341 disposed on the N-type drain region 141 and a second metal silicide layer 342 disposed on the N-type source region 142. The first metal silicide layer 341 may reduce contact resistance between the drain electrodes 161 and the N-type drain region 141. Similarly, the second metal silicide layer 342 may reduce contact resistance between the source electrodes 162 and the N-type source region 142. However, as illustrated in FIG. 3, no metal silicide layers may be disposed on the first and second blocking regions 151 and 152. This is because the N-type drain region 141 and the N-type source region 142 may be electrically coupled to each other through metal silicide layers if the metal silicide layers are disposed on the first and second blocking regions 151 and 152.

Figure 6:
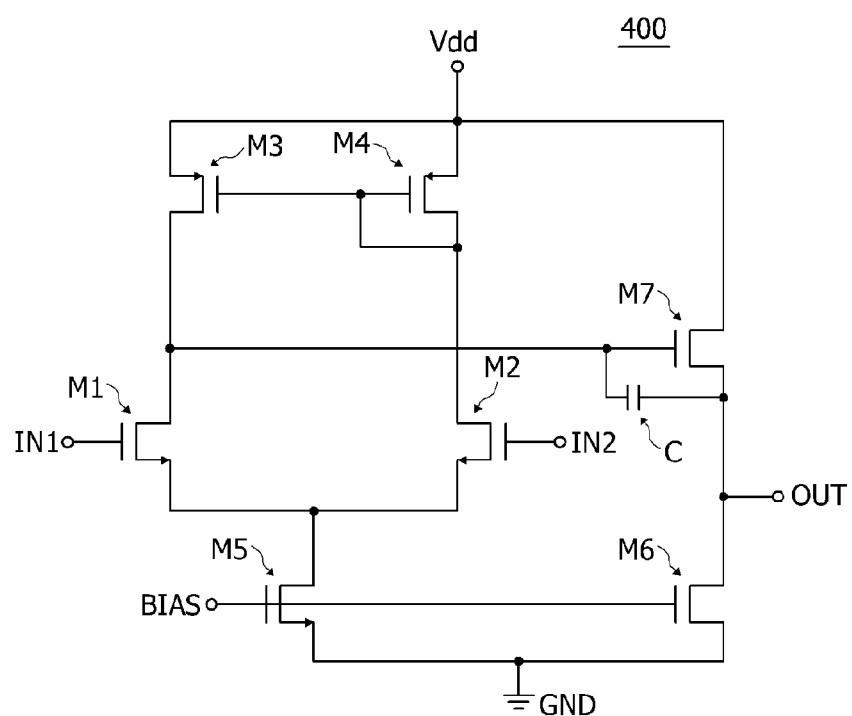
FIG. 6 is a circuit diagram illustrating an electronic device including MOS transistors according to an embodiment of the present disclosure.

FIG. 6 is a circuit diagram illustrating an electronic device including MOS transistors according to an embodiment of the present disclosure. Each of the MOS transistors constituting the electronic device of FIG. 6 may have a structure of any one of the MOS transistors described with reference to FIGS. 1 to 5.

Referring to FIG. 6, an electronic device 400 includes an operational amplifier (OP-AMP). Specifically, the electronic device 400 includes a first MOS transistor M1 and a second MOS transistor M2 that function as input transistors. The electronic device 400 further includes a third MOS transistor M3 and a fourth MOS transistor M4 that function as load transistors. The first and second MOS transistors M1 and M2 may be N-channel MOS transistors, and the third and fourth MOS transistors may be P-channel MOS transistors.

A gate electrode of the first MOS transistor M1 is connected to a first input terminal IN1. In an embodiment, the first input terminal IN1 is a non-inverting input terminal of the OP-AMP. A gate terminal of the second MOS transistor M2 is connected to a second input terminal IN2. In an embodiment, the second input terminal IN2 is an inverting input terminal of the OP-AMP. A voltage level of a first input signal applied to the first input terminal IN1 may be identical to or different from a voltage level of a second input signal applied to the second input terminal IN2. This may depend on a function of the OP-AMP.

Source terminals of the first and second MOS transistors M1 and M2 are electrically coupled to a drain terminal of a fifth MOS transistor M5. A source terminal of the fifth MOS transistor M5 is electrically coupled to a ground voltage terminal GND. The fifth MOS transistor M5 operates in response to a bias voltage signal BIAS applied to a gate terminal thereof to make a current of the electronic device 400 constant. The first and second MOS transistors M1 and M2 may constitute a differential amplifier.

The third and fourth MOS transistors M3 and M4 may constitute a current mirror circuit. A gate terminal of the third MOS transistor M3 is electrically coupled to a gate terminal of the fourth MOS transistor M4. A drain terminal of the third MOS transistor M3 is electrically coupled to a drain terminal of the first MOS transistor M1. A drain terminal of the fourth MOS transistor M4 is electrically coupled to a drain terminal of the second MOS transistor M2 and the gate electrode of the fourth MOS transistor M4. Source terminals of the third and fourth MOS transistors M3 and M4 are electrically coupled to a power supply voltage terminal VDD.

In the configuration shown in FIG. 6, if the second MOS transistor M2 is turned on, the fourth MOS transistor M4 is also turned on to generate a drive current that flows through the second and fourth MOS transistors M2 and M4. In addition, if the fourth MOS transistor M4 is turned on to generate the drive current, the third MOS transistor M3 is also turned on to generate a mirroring current having the same amount as that of the drive current, and the mirroring current flows toward the first MOS transistor M1.

An output circuit of the OP-AMP includes a sixth MOS transistor M6 and a seventh MOS transistor M7. The sixth MOS transistor M6 may be an N-channel MOS transistor, and the seventh MOS transistor M7 may be a P-channel MOS transistor. A source terminal of the sixth MOS transistor M6 is electrically coupled to the ground voltage terminal GND, and a source terminal of the seventh MOS transistor M7 is electrically coupled to the power supply voltage terminal VDD. A drain terminal of the sixth MOS transistor M6 is electrically coupled to a drain terminal of the seventh MOS transistor M7, and the drain terminals of the sixth and seventh MOS transistors M6 and M7 are electrically coupled to an output terminal OUT of the electronic device 400. The drain terminal of the first MOS transistor M1 is electrically coupled to a gate electrode of the seventh MOS transistor M7. Moreover, a capacitor C compensating for a frequency of an output signal may be coupled between the gate electrode of the seventh MOS transistor M7 and the output terminal OUT, i.e., the drain terminals of the sixth and seventh MOS transistors M6 and M7. A gate electrode of the seventh MOS transistor M6 is electrically coupled to the gate electrode of the fifth MOS transistor M5 to receive the bias voltage signal BIAS.

In the electronic device 400 having the aforementioned configuration, if the first MOS transistor M1 and the second MOS transistor M2 receiving two input signals have different characteristics, for example, different threshold voltages or different transconductance, there may be an offset value between characteristics of the first and second MOS transistors M1 and M2. This offset value may be caused by a step difference between top surfaces of the active regions in which the first and second MOS transistors M1 and M2 formed and a top surface of the isolation region surrounding the active regions if gate electrodes of the first and second MOS transistors M1 and M2 are disposed to cover both of the active regions and the isolation region. However, according to an embodiment, the gate electrodes of at least the first and second MOS transistors M1 and M2 are disposed on the active regions, which do not overlap with the isolation layer. Thus, the offset value between the characteristics of the first and second MOS transistors M1 and M2 may be minimized, and the function of the electronic device 400, for example, the OP-AMP, is improved.

Figure 7:
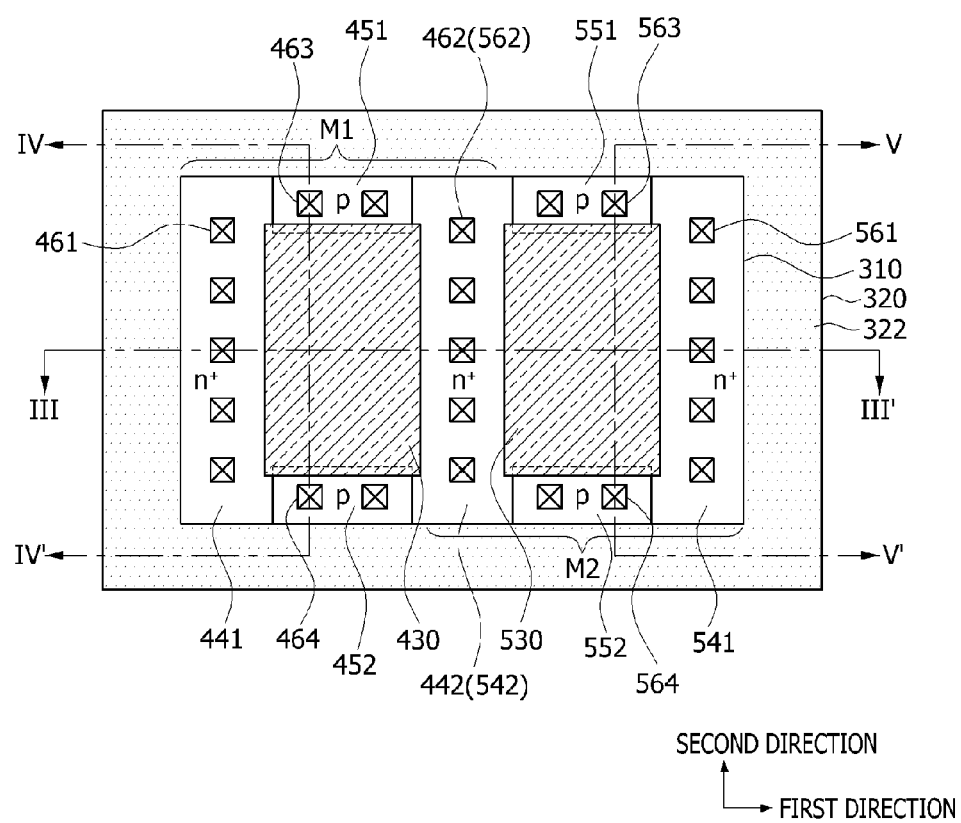
FIG. 7 is a layout diagram illustrating a first MOS transistor and a second MOS transistor included in the electronic device of FIG. 6 according to an embodiment of the present disclosure.
Figure 8:
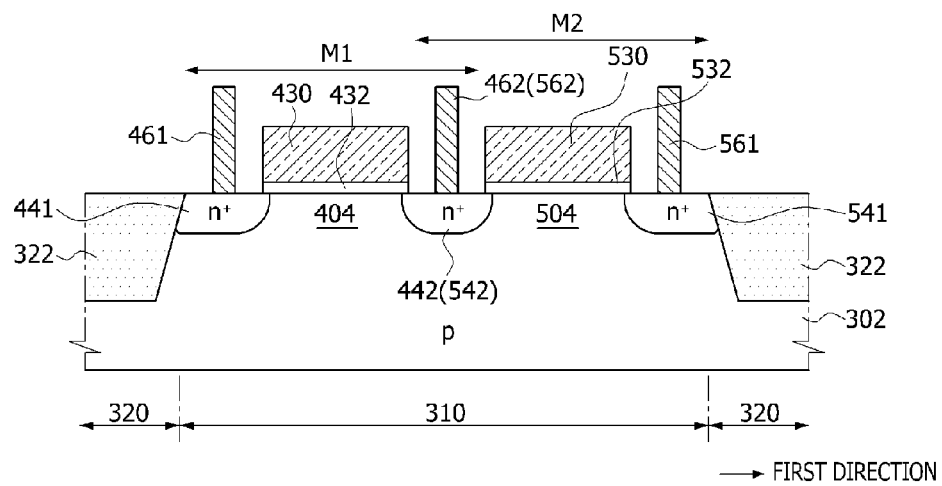
FIG. 8 illustrates a cross-sectional view taken along a line III-III' of FIG. 7.
Figure 9:
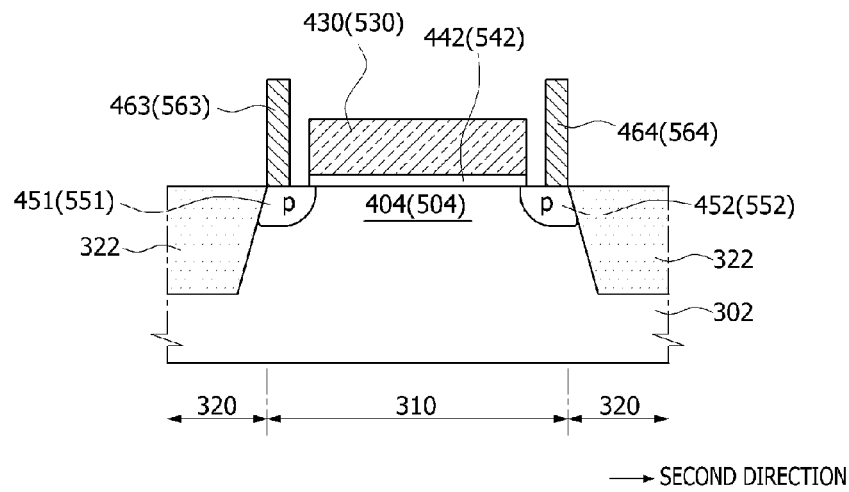
FIG. 9 illustrates a cross-sectional view taken along a line V-V' or V-V' of FIG. 7.

FIG. 7 is a layout diagram illustrating the first MOS transistor M1 and the second MOS transistor M2 included in the electronic device of FIG. 6 according to an embodiment. FIG. 8 is a cross-sectional view taken along a line III-III' of FIG. 7, and FIG. 9 is a cross-sectional view taken along a line IV-IV' of FIG. 7. A cross-sectional view of the first MOS transistor M1 taken along the line IV-IV' of FIG. 7 is identical to a cross-sectional view of the second MOS transistor M2 taken along a line V-V' of FIG. 7. Thus, FIG. 9 also illustrates the cross-sectional view of the second MOS transistor M2 taken along the line V-V' of FIG. 7.

Referring to FIGS. 7, 8, and 9, an isolation layer 322 is disposed in an isolation region 320 of a semiconductor substrate 302 to define an active region 310. The isolation region 320 is disposed around a perimeter of the active region, and surrounds the active region 310 in a plan view. The first MOS transistor M1 and the second MOS transistor M2 are disposed in the active region 310. The first and second MOS transistors M1 and M2 according to the present embodiment may be N-channel MOS transistors. Thus, the semiconductor substrate 302 may be a P-type substrate. In another embodiment, the semiconductor substrate 302 including the first and second N-channel MOS transistors M1 and M2 may be an N-type substrate. In such a case, a P-type well region may be disposed in the semiconductor substrate 302, and the active region 310 may be defined in the P-type well region. In another embodiment, the first and second MOS transistors M1 and M2 illustrated in FIG. 7 may be P-channel MOS transistors. In such a case, the P-channel MOS transistors may have substantially the same configuration as the N-channel MOS transistors described above except that conductivity types of some elements thereof are opposite to those of the N-channel MOS transistors. That is, when the first and second MOS transistors M1 and M2 illustrated in FIG. 7 are P-channel MOS transistors, the semiconductor substrate 302 may be an N-type substrate or a P-type substrate, and an N-type well region may be additionally disposed in the semiconductor substrate 302 if the semiconductor substrate 302 is the P-type substrate.

Although FIG. 7 illustrates an embodiment that the active region 310 has a rectangular shape in a plan view, embodiments are not limited thereto. In another embodiment, the active region 310 has a different shape from the rectangular shape. The active region 310 may have a flat top surface which is parallel with a horizontal surface. The isolation layer 322 may be an insulation layer filling a trench region which is disposed in the semiconductor substrate 302 to have a predetermined depth. That is, the isolation layer 322 may be a trench isolation layer. Although not shown in the drawings, a step difference, or a difference in relative positions, may exist between a top surface of the active region 310 and a top surface of the isolation layer 322. In particular, a top surface of the active region 310 in which the first MOS transistor M1 is disposed and a top surface of the isolation layer 322 adjacent to the first MOS transistor M1 may have different surface profiles from those of a top surface of the active region 310 in which the second MOS transistor M2 is disposed and a top surface of the isolation layer 322 adjacent to the second MOS transistor M2 because of the non-uniformity of fabrication processes.

The first MOS transistor M1 includes a gate insulation layer pattern 432 and a gate electrode 430 which are sequentially stacked on a portion of the active region 310. In an embodiment, the gate insulation layer pattern 432 includes an oxide layer. In another embodiment, the gate insulation layer pattern 432 includes an insulation layer different from the oxide layer. In an embodiment, the gate electrode 430 includes a doped polysilicon layer. In another embodiment, the gate electrode 430 includes a conductive layer different from the doped polysilicon layer. The gate electrode 430 may be disposed only on a portion of the active region 310 without overlapping with the isolation layer 322. Although FIG. 7 illustrates an embodiment that the gate electrode 430 has a rectangular shape in a plan view, embodiments are not limited thereto. In another embodiment, the gate electrode 430 has a different shape from the rectangular shape. The gate electrode 430 may have a plate form which is parallel with the top surface of the active region 310. A portion of the active region 310, including the surface that overlaps with the gate electrode 430, may correspond to a channel region 404. The channel region 404 may be inverted to have an opposite conductivity type to an original conductivity type thereof when a gate voltage higher than a threshold voltage is applied to the gate electrode 430. Thus, the inverted channel region 404 acts as a current path through which carriers (e.g., electrons) are drifted. In an embodiment, the gate electrode 430 has a width and a length which is greater than the width when viewed from a plan view, as in a layout diagram of FIG. 7. In such a case, a direction along which a width of the gate electrode 430 extends may be parallel with a first direction and a direction along which a length of the gate electrode 430 extends may be parallel with a second direction perpendicular to the first direction. The width of the gate electrode 430 may correspond to a channel length of the first MOS transistor M1 and the length of the gate electrode 430 may correspond to a channel width of the first MOS transistor M1.

A drain region 441 heavily doped with N-type impurities is disposed in an upper portion of the active region 310. Viewing FIG. 7 along the first direction, the drain region 441 is disposed between the isolation layer 322 adjacent to one end of the gate electrode 430 and the one end of the gate electrode 430. A source region 442 heavily doped with N-type impurities is disposed in an upper portion of the active region 310, which is adjacent to the other end of the gate electrode 430 in the first direction. The N-type source region 442 of the first MOS transistor M1 may also act as a source region 542 of the second MOS transistor M2. That is, as described with reference to FIG. 6, the source terminal of the first MOS transistor M1 is connected to the source terminal of the second MOS transistor M2. As a result, the first and second MOS transistors M1 and M2 are formed to share the N-type source region 442 (or 542).

A first blocking region 451 doped with P-type impurities is disposed in an upper portion of the active region 310. Viewing FIG. 7 along the second direction, the first blocking region 451 is disposed between one end of the gate electrode 430 and the isolation layer 322 adjacent to the one end of the gate electrode 430. A second blocking region 452 doped with P-type impurities is disposed in an upper portion of the active region 310. Viewing FIG. 7 along the second direction, the second blocking region 452 is disposed between the isolation layer 322 adjacent to the other end of the gate electrode 430 and the other end of the gate electrode 430. The first and second blocking regions 451 and 452 may have the same conductivity type, e.g., a P-type, as that of the active region 310. Thus, a drain current of the first MOS transistor M1 can flow from the N-type drain region 441 toward the N-type source region 442 only through the inverted channel region 404 because both the first and second blocking regions 451 and 452 disposed between the N-type drain region 441 and the N-type source region 442 have the same conductivity type as that of the active region 310. Drain electrodes 461 are disposed on the N-type drain region 441, and source electrodes 462 are disposed on the N-type source region 442. A drain voltage of the first MOS transistor M1 may be applied to the N-type drain region 441 through the drain electrodes 461, and a source voltage of the first MOS transistor M1 may be applied to the N-type source region 442 through the source electrodes 462. Each of the drain electrodes 461 and the source electrodes 462 may include a metal layer.

If the first MOS transistor M1 operates when the first and second blocking regions 451 and 452 are electrically floated, leakage currents may flows between the N-type drain region 441 and the N-type source region 442 because electric potentials of the first and second blocking regions 451 and 452 are unstable. Thus, a certain bias voltage should be applied to the first and second blocking regions 451 and 452 in order that the first MOS transistor M1 stably operates. In order to apply an appropriate bias voltage to the first and second blocking regions 451 and 452, first contacts 463 and second contacts 464 are disposed on the first blocking region 451 and the second blocking region 452, respectively. Each of the first and second contacts 463 and 464 may include a metal layer.

If the first MOS transistor M1 is an N-channel MOS transistor, the bias voltage applied to the first and second blocking regions 451 and 452 through the first and second contacts 463 and 464 may be set to be lower than a source voltage applied to the N-type source region 442. That is, a reverse bias is applied to a P-N junction between each of the first and second blocking regions 451 and 452 and each of the drain and source regions 441 and 442. In another embodiment, the bias voltage applied to the first and second blocking regions 451 and 452 through the first and second contacts 463 and 464 may be set to be equal to the source voltage applied to the N-type source region 442.

The second MOS transistor M2 includes a gate insulation layer pattern 532 and a gate electrode 530 which are sequentially stacked on a portion of the active region 310. In an embodiment, the gate insulation layer pattern 532 includes an oxide layer. In another embodiment, the gate insulation layer pattern 532 includes an insulation layer different from the oxide layer. In an embodiment, the gate electrode 530 includes a doped polysilicon layer. In another embodiment, the gate electrode 530 includes a conductive layer different from the doped polysilicon layer. The gate electrode 530 may be disposed only on a portion of the active region 310, and does not overlap with the isolation layer 322.

Although FIG. 7 illustrates an embodiment that the gate electrode 530 has a rectangular shape in a plan view, embodiments are not limited thereto. In another embodiment, the gate electrode 530 has a different shape from the rectangular shape. The gate electrode 530 may have a plate form which is parallel with the top surface of the active region 310. A surface layer of the active region 310 overlapping with the gate electrode 530 may correspond to a channel region 504. The channel region 504 may be inverted to have an opposite conductivity type to an original conductivity type thereof when a gate voltage higher than a threshold voltage is applied to the gate electrode 530. Thus, the inverted channel region 504 acts as a current path through which carriers (e.g., electrons) are drifted. In an embodiment, the gate electrode 530 has a width and a length which is greater than the width when viewed from a plan view, as in the layout diagram of FIG. 7. In such a case, a direction along which a width of the gate electrode 530 extends may be parallel with the first direction and a direction along which a length of the gate electrode 530 extends may be parallel with the second direction perpendicular to the first direction. The width of the gate electrode 530 in the first direction may correspond to a channel length of the second MOS transistor M2 and the length of the gate electrode 530 in the second direction may correspond to a channel width of the second MOS transistor M2.

A drain region 541 heavily doped with N-type impurities is disposed in an upper portion of the active region 310 and between one end of the gate electrode 530 in the first direction and the isolation layer 322 adjacent to the one end of the gate electrode 530. A source region 542 heavily doped with N-type impurities is disposed in an upper portion of the active region 310 between the gate electrode 530 of the second MOS transistor M2 and the gate electrode 430 of the first MOS transistor M1. As described above, the N-type source region 542 of the second MOS transistor M2 also acts as the source region 442 of the first MOS transistor M1.

A first blocking region 551 doped with P-type impurities is disposed in an upper portion of the active region 310. Viewing FIG. 7 along the second direction, the first blocking region 551 is disposed between one end of the gate electrode 530 and the isolation layer 322 adjacent to the one end of the gate electrode 530. A second blocking region 552 doped with P-type impurities is disposed in an upper portion of the active region 310. Viewing FIG. 7 along the second direction, the second blocking region 552 is disposed between the isolation layer 322 adjacent to the other end of the gate electrode 530 and the other end of the gate electrode 530. The first and second blocking regions 551 and 552 may have the same conductivity type, e.g., a P-type, as that of the active region 310. Thus, a drain current of the second MOS transistor M2 can flow from the N-type drain region 541 toward the N-type source region 542 only through the inverted channel region 504 because both the first and second blocking regions 551 and 552 disposed between the N-type drain region 541 and the N-type source region 542 have the same conductivity type as that of the active region 310.

Drain electrodes 561 are disposed on the N-type drain region 541, and source electrodes 562 are disposed on the N-type source region 542. A drain voltage of the second MOS transistor M2 may be applied to the N-type drain region 541 through the drain electrodes 561, and a source voltage of the second MOS transistor M2 may be applied to the N-type source region 542 through the source electrodes 562. Each of the drain electrodes 561 and the source electrodes 562 may include a metal layer.

If the second MOS transistor M2 operates when the first and second blocking regions 551 and 552 are electrically floated, leakage currents may flows between the N-type drain region 541 and the N-type source region 542 because electric potentials of the first and second blocking regions 551 and 552 are unstable. Thus, a certain bias voltage should be applied to the first and second blocking regions 551 and 552 in order that the second MOS transistor M2 stably operates. In order to apply an appropriate bias voltage to the first and second blocking regions 551 and 552, first contacts 563 and second contacts 564 are disposed on the first blocking region 551 and the second blocking region 552, respectively. Each of the first and second contacts 563 and 564 may include a metal layer.

If the second MOS transistor M2 is an N-channel MOS transistor, the bias voltage applied to the first and second blocking regions 551 and 552 through the first and second contacts 563 and 564 may be set to be lower than the source voltage applied to the N-type source region 542. That is, a reverse bias is applied to a P-N junction between each of the first and second blocking regions 551 and 552 and each of the drain and source regions 541 and 542. In another embodiment, the bias voltage applied to the first and second blocking regions 551 and 552 through the first and second contacts 563 and 564 may be set to be equal to the source voltage applied to the N-type source region 542.

Figure 10:
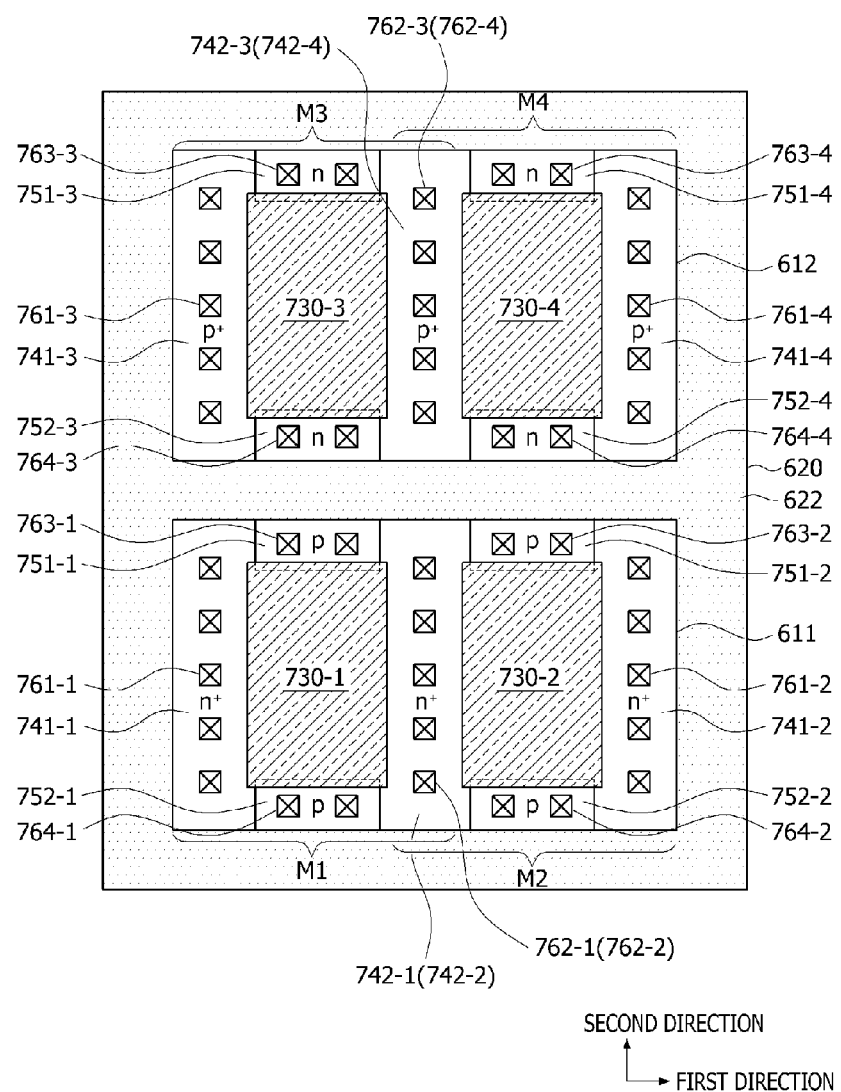
FIG. 10 is a layout diagram illustrating first to fourth MOS transistors included in the electronic device of FIG. 6 according to an embodiment of the present disclosure.

FIG. 10 is a layout diagram illustrating the first to fourth MOS transistors M1 to M4 included in the electronic device of FIG. 6 according to an embodiment. In the present embodiment, each of the first to fourth MOS transistors M1, M2, M3, and M4 may include a gate electrode that is disposed on a portion of an active region. Gate electrodes of the MOS transistors M1, M2, M3, and M4 do not overlap with an isolation layer in a plan view. Referring to FIG. 10, the first and second MOS transistors M1 and M2 are disposed on a first active region 611, and the third and fourth MOS transistors M3 and M4 are disposed on a second active region 612 which is spaced apart from the first active region 611 along a second direction. The first and second active regions 611 and 612 are defined by an isolation layer 622 disposed in an isolation region 620. The isolation region 620 is disposed to surround the first and second active regions 611 and 612. The first and second MOS transistors M1 and M2 may be N-channel MOS transistors, and the third and fourth MOS transistors M3 and M4 may be P-channel MOS transistors. In such a case, the first active region 611 may have a P-type conductivity, and the second active region 612 may have an N-type conductivity.

Although FIG. 10 illustrates an embodiment that each of the first and second active regions 611 and 612 has a rectangular shape in a plan view, embodiments are not limited thereto. In an embodiment, at least one of the first and second active regions 611 and 612 has a different shape from the rectangular shape. Each of the first and second active regions 611 and 612 may have a flat top surface which is parallel with a horizontal surface. The isolation layer 622 may be a trench isolation layer. Although not shown in the drawings, a step difference may exist between top surfaces of the active regions 611 and 612 and a top surface of the isolation layer 622. For example, a step difference between the top surface of the first active region 611 and the top surface of the isolation layer 622 may be different from a step difference between the top surface of the second active region 612 and the top surface of the isolation layer 622 because of the non-uniformity of fabrication processes.

The first MOS transistor M1 disposed in the first active region 611 includes a gate electrode 730-1, an N-type drain region 741-1, an N-type source region 742-1, a first P-type blocking region 751-1, and a second P-type blocking region 752-1. The gate electrode 730-1 is disposed on a portion of the first active region 611 without overlapping with the isolation region 620 in which the isolation layer 622 is disposed. Although not shown in FIG. 10, a gate insulation layer pattern may be disposed between the first active region 611 and the gate electrode 730-1. The N-type drain region 741-1 is disposed in an upper portion of the first active region 611 between one end of the gate electrode 730-1 in a first direction and the isolation region 620 adjacent to the one end of the gate electrode 730-1. The N-type source region 742-1 is disposed in an upper portion of the first active region 611 which is adjacent to the other end of the gate electrode 730-1 in the first direction. As described with reference to FIG. 6, the N-type source region 742-1 of the first MOS transistor M1 may be electrically coupled to a source region of the second MOS transistor M2. That is, the first and second MOS transistors M1 and M2 may share a single source region. Thus, the N-type source region 742-1 of the first MOS transistor M1 may also act as an N-type source region 742-2 of the second MOS transistor M2.

The first P-type blocking region 751-1 is disposed in an upper portion of the first active region 611. Viewing FIG. 10 along the second direction, the first P-type blocking region 751-1 is disposed between one end of the gate electrode 730-1 and the isolation region 620 adjacent to the one end of the gate electrode 730-1. The second P-type blocking region 752-1 is disposed in an upper portion of the first active region 611. Viewing FIG. 10 along the second direction, the second P-type blocking region 752-1 is disposed between the isolation region 620 adjacent to the other end of the gate electrode 730-1 and the other end of the gate electrode 730-1. The first and second blocking regions 751-1 and 752-1 may have the same conductivity type, e.g., a P-type, as that of the first active region 611. Thus, a drain current of the first MOS transistor M1 can flow from the N-type drain region 741-1 toward the N-type source region 742-1 only through an inverted channel region under the gate electrode 730-1 because both the first and second P-type blocking regions 751-1 and 752-1 disposed between the N-type drain region 741-1 and the N-type source region 742-1 have the same conductivity type as that of the first active region 611. Drain electrodes 761-1 are disposed on the N-type drain region 741-1, and source electrodes 762-1 are disposed on the N-type source region 742-1.

If the first MOS transistor M1 operates when the first and second P-type blocking regions 751-1 and 752-1 are electrically floated, leakage currents may flows between the N-type drain region 741-1 and the N-type source region 742-1 because electric potentials of the first and second P-type blocking regions 751-1 and 752-1 are unstable. Thus, a certain bias voltage should be applied to the first and second P-type blocking regions 751-1 and 752-1 in order that the first MOS transistor M1 stably operates. In order to apply an appropriate bias voltage to the first and second blocking regions 751-1 and 752-1, first contacts 763-1 and second contacts 764-1 are disposed on the first P-type blocking region 751-1 and the second P-type blocking region 752-1, respectively. Each of the first and second contacts 763-1 and 764-1 may include a metal layer.

If the first MOS transistor M1 is an N-channel MOS transistor, the bias voltage applied to the first and second P-type blocking regions 751-1 and 752-1 through the first and second contacts 763-1 and 764-1 may be set to be lower than a source voltage applied to the N-type source region 742-1. That is, a reverse bias is applied to a P-N junction between each of the first and second P-type blocking regions 751-1 and 752-1 and each of the N-type drain and source regions 741-1 and 742-1. In another embodiment, the bias voltage applied to the first and second P-type blocking regions 751-1 and 752-1 through the first and second contacts 763-1 and 764-1 may be set to be equal to the source voltage applied to the N-type source region 742-1.

The second MOS transistor M2 disposed in the first active region 611 includes a gate electrode 730-2, an N-type drain region 741-2, an N-type source region 742-2, a first P-type blocking region 751-2, and a second P-type blocking region 752-2. The gate electrode 730-2 is disposed on another portion of the first active region 611 without overlapping with the isolation region 620 in which the isolation layer 622 is disposed. The gate electrode 730-2 is disposed to be spaced apart from the gate electrode 730-1 of the first MOS transistor M1 along the first direction. Although not shown in FIG. 10, a gate insulation layer pattern may be disposed between the first active region 611 and the gate electrode 730-2. The N-type drain region 741-2 is disposed in an upper portion of the first active region 611. Viewing FIG. 10 along the first direction, the N-type drain region 741-2 is disposed between one end of the gate electrode 730-2 in the first direction and the isolation region 620 adjacent to the one end of the gate electrode 730-2. The N-type source region 742-2 is disposed in an upper portion of the first active region 611. Viewing FIG. 10 along the first direction, N-type source region 742-2 is disposed between the gate electrode 730-1 of the first MOS transistor M1 and the gate electrode 730-2 of the second MOS transistor M2.

The first P-type blocking region 751-2 is disposed in an upper portion of the first active region 611. Viewing FIG. 10 along the second direction, the first P-type blocking region 751-2 is disposed between the isolation region 620 adjacent to one end of the gate electrode 730-2 and the one end of the gate electrode 730-2. The second P-type blocking region 752-2 is disposed in an upper portion of the first active region 611. Viewing FIG. 10 along the second direction, the second P-type blocking region 752-2 is disposed between the other end of the gate electrode 730-2 and the isolation region 620 adjacent to the other end of the gate electrode 730-2.

The first and second blocking regions 751-2 and 752-2 may have the same conductivity type, e.g., a P-type, as that of the first active region 611. Thus, a drain current of the second MOS transistor M2 can flow from the N-type drain region 741-2 toward the N-type source region 742-2 only through an inverted channel region under the gate electrode 730-2 because both the first and second P-type blocking regions 751-2 and 752-2 disposed between the N-type drain region 741-2 and the N-type source region 742-2 have the same conductivity type as that of the first active region 611. Drain electrodes 761-2 are disposed on the N-type drain region 741-2, and source electrodes 762-2 are disposed on the N-type source region 742-2.

If the second MOS transistor M2 operates when the first and second P-type blocking regions 751-2 and 752-2 are electrically floated, leakage currents may flows between the N-type drain region 741-2 and the N-type source region 742-2 because electric potentials of the first and second P-type blocking regions 751-2 and 752-2 are unstable. Thus, a certain bias voltage should be applied to the first and second P-type blocking regions 751-2 and 752-2 in order that the second MOS transistor M2 stably operates. In order to apply an appropriate bias voltage to the first and second blocking regions 751-2 and 752-2, first contacts 763-2 and second contacts 764-2 are disposed on the first P-type blocking region 751-2 and the second P-type blocking region 752-2, respectively. Each of the first and second contacts 763-2 and 764-2 may include a metal layer.

If the second MOS transistor M2 is an N-channel MOS transistor, the bias voltage applied to the first and second P-type blocking regions 751-2 and 752-2 through the first and second contacts 763-2 and 764-2 may be set to be lower than a source voltage applied to the N-type source region 742-2. That is, a reverse bias is applied to a P-N junction between each of the first and second P-type blocking regions 751-2 and 752-2 and each of the N-type drain and source regions 741-2 and 742-2. In another embodiment, the bias voltage applied to the first and second P-type blocking regions 751-2 and 752-2 through the first and second contacts 763-2 and 764-2 may be set to be equal to the source voltage applied to the N-type source region 742-2.

The third MOS transistor M3 disposed in the second active region 612 includes a gate electrode 730-3, a P-type drain region 741-3, a P-type source region 742-3, a first N-type blocking region 751-3, and a second N-type blocking region 752-3. The gate electrode 730-3 is disposed on a portion of the second active region 612 without overlapping with the isolation region 620 in which the isolation layer 622 is disposed. Although not shown in FIG. 10, a gate insulation layer pattern may be disposed between the second active region 612 and the gate electrode 730-3.

The P-type drain region 741-3 is disposed in an upper portion of the second active region 612. Viewing FIG. 10 along the first direction, the P-type drain region 741-3 is disposed between the isolation region 620 adjacent to one end of the gate electrode 730-3 and the one end of the gate electrode 730-3. The P-type source region 742-3 is disposed in an upper portion of the second active region 612, which is adjacent to the other end of the gate electrode 730-3 in the first direction. As described with reference to FIG. 6, the P-type source region 742-3 of the third MOS transistor M3 is electrically coupled to a source region of the fourth MOS transistor M4. That is, the third and fourth MOS transistors M3 and M4 may share a single source region. Thus, the P-type source region 742-3 of the third MOS transistor M3 may also act as a P-type source region 742-4 of the fourth MOS transistor M4.

The first N-type blocking region 751-3 is disposed in an upper portion of the second active region 612. Viewing FIG. 10 along the second direction, the first N-type blocking region 751-3 is disposed between one end of the gate electrode 730-3 and the isolation region 620 adjacent to the one end of the gate electrode 730-3. The second N-type blocking region 752-3 is disposed in an upper portion of the second active region 612. Viewing FIG. 10 along the second direction, the second N-type blocking region 752-3 is disposed between the isolation region 620 adjacent to the other end of the gate electrode 730-3 and the other end of the gate electrode 730-3. The first and second blocking regions 751-3 and 752-3 may have the same conductivity type, e.g., an N-type, as that of the second active region 612. Thus, a drain current of the third MOS transistor M3 can flow from the P-type drain region 741-3 toward the P-type source region 742-3 only through an inverted channel region under the gate electrode 730-3 because both the first and second N-type blocking regions 751-3 and 752-3 disposed between the P-type drain region 741-3 and the P-type source region 742-3 have the same conductivity type as the second active region 612.

Drain electrodes 761-3 are disposed on the P-type drain region 741-3, and source electrodes 762-3 are disposed on the P-type source region 742-3. As described with reference to FIG. 6, the P-type drain region 741-3 of the third MOS transistor M3 is electrically coupled to the N-type drain region 741-1 of the first MOS transistor M1. Thus, although not shown in FIG. 10, the drain electrodes 761-3 of the third MOS transistor M3 may be electrically coupled to the drain electrodes 761-1 of the first MOS transistor M1 through an interconnection line.

If the third MOS transistor M3 operates when the first and second N-type blocking regions 751-3 and 752-3 are electrically floated, leakage currents may flows between the P-type drain region 741-3 and the P-type source region 742-3 because electric potentials of the first and second N-type blocking regions 751-3 and 752-3 are unstable. Thus, a certain bias voltage should be applied to the first and second N-type blocking regions 751-3 and 752-3 so that the third MOS transistor M3 stably operates. In order to apply an appropriate bias voltage to the first and second blocking regions 751-3 and 752-3, first contacts 763-3 and second contacts 764-3 are disposed on the first N-type blocking region 751-3 and the second N-type blocking region 752-3, respectively. Each of the first and second contacts 763-3 and 764-3 may include a metal layer.

If the third MOS transistor M3 is a P-channel MOS transistor, the bias voltage applied to the first and second N-type blocking regions 751-3 and 752-3 through the first and second contacts 763-3 and 764-3 may be set to be higher than a source voltage applied to the P-type source region 742-3. That is, a reverse bias is applied to a P-N junction between each of the first and second N-type blocking regions 751-3 and 752-3 and each of the P-type drain and source regions 741-3 and 742-3. In another embodiment, the bias voltage applied to the first and second N-type blocking regions 751-3 and 752-3 through the first and second contacts 763-3 and 764-3 may be set to be equal to the source voltage applied to the P-type source region 742-3.

The fourth MOS transistor M4 disposed in the second active region 612 includes a gate electrode 730-4, a P-type drain region 741-4, a P-type source region 742-4, a first N-type blocking region 751-4, and a second N-type blocking region 752-4. The gate electrode 730-4 is disposed on another portion of the second active region 612 without overlapping with the isolation region 620 in which the isolation layer 622 is disposed. The gate electrode 730-4 is disposed to be spaced apart from the gate electrode 730-3 of the third MOS transistor M3 along the first direction. Although not shown in FIG. 10, a gate insulation layer pattern may be disposed between the second active region 612 and the gate electrode 730-4. The P-type drain region 741-4 is disposed in an upper portion of the second active region 612. Viewing FIG. 10 along the first direction, the P-type drain region 741-4 is disposed between one end of the gate electrode 730-4 and the isolation region 620 adjacent to the one end of the gate electrode 730-4. The P-type source region 742-4 is disposed in an upper portion of the second active region 612. The P-type source region 742-4 is disposed between the gate electrode 730-3 of the third MOS transistor M3 and the gate electrode 730-4 of the fourth MOS transistor M4.

The first N-type blocking region 751-4 is disposed in an upper portion of the second active region 612. Viewing FIG. 10 along the second direction, the first N-type blocking region 751-4 is disposed between one end of the gate electrode 730-4 in the second direction and the isolation region 620 adjacent to the one end of the gate electrode 730-4. The second N-type blocking region 752-4 is disposed in an upper portion of the second active region 612. Viewing FIG. 10 along the second direction, the second N-type blocking region 752-4 is disposed between the isolation region 620 adjacent to the other end of the gate electrode 730-4 and the other end of the gate electrode 730-4. The first and second blocking regions 751-4 and 752-4 may have the same conductivity type, e.g., an N-type, as that of the second active region 612. Thus, a drain current of the fourth MOS transistor M4 can flow from the P-type drain region 741-4 toward the P-type source region 742-4 only through an inverted channel region under the gate electrode 730-4 because both the first and second N-type blocking regions 751-4 and 752-4 disposed between the P-type drain region 741-4 and the P-type source region 742-4 have the same conductivity type as the second active region 612.

Drain electrodes 761-4 are disposed on the P-type drain region 741-4, and source electrodes 762-4 are disposed on the P-type source region 742-4. As described with reference to FIG. 6, the P-type drain region 741-4 of the fourth MOS transistor M4 are electrically coupled to the N-type drain region 741-2 of the second MOS transistor M2. Thus, although not shown in FIG. 10, the drain electrodes 761-4 of the fourth MOS transistor M4 may be electrically coupled to the drain electrodes 761-2 of the second MOS transistor M2 through an interconnection line.

If the fourth MOS transistor M4 operates when the first and second N-type blocking regions 751-4 and 752-4 are electrically floated, leakage currents may flows between the P-type drain region 741-4 and the P-type source region 742-4 because electric potentials of the first and second N-type blocking regions 751-4 and 752-4 are unstable. Thus, a certain bias voltage should be applied to the first and second N-type blocking regions 751-4 and 752-4 so that the fourth MOS transistor M4 stably operates. In order to apply an appropriate bias voltage to the first and second blocking regions 751-4 and 752-4, first contacts 763-4 and second contacts 764-4 are disposed on the first N-type blocking region 751-4 and the second N-type blocking region 752-4, respectively. Each of the first and second contacts 763-4 and 764-4 may include a metal layer.

If the fourth MOS transistor M4 is a P-channel MOS transistor, the bias voltage applied to the first and second N-type blocking regions 751-4 and 752-4 through the first and second contacts 763-4 and 764-4 may be set to be higher than a source voltage applied to the P-type source region 742-4. That is, a reverse bias is applied to a P-N junction between each of the first and second N-type blocking regions 751-4 and 752-4 and each of the P-type drain and source regions 741-4 and 742-4. In another embodiment, the bias voltage applied to the first and second N-type blocking regions 751-4 and 752-4 through the first and second contacts 763-4 and 764-4 may be set to be equal to the source voltage applied to the P-type source region 742-4.

Figure 11:
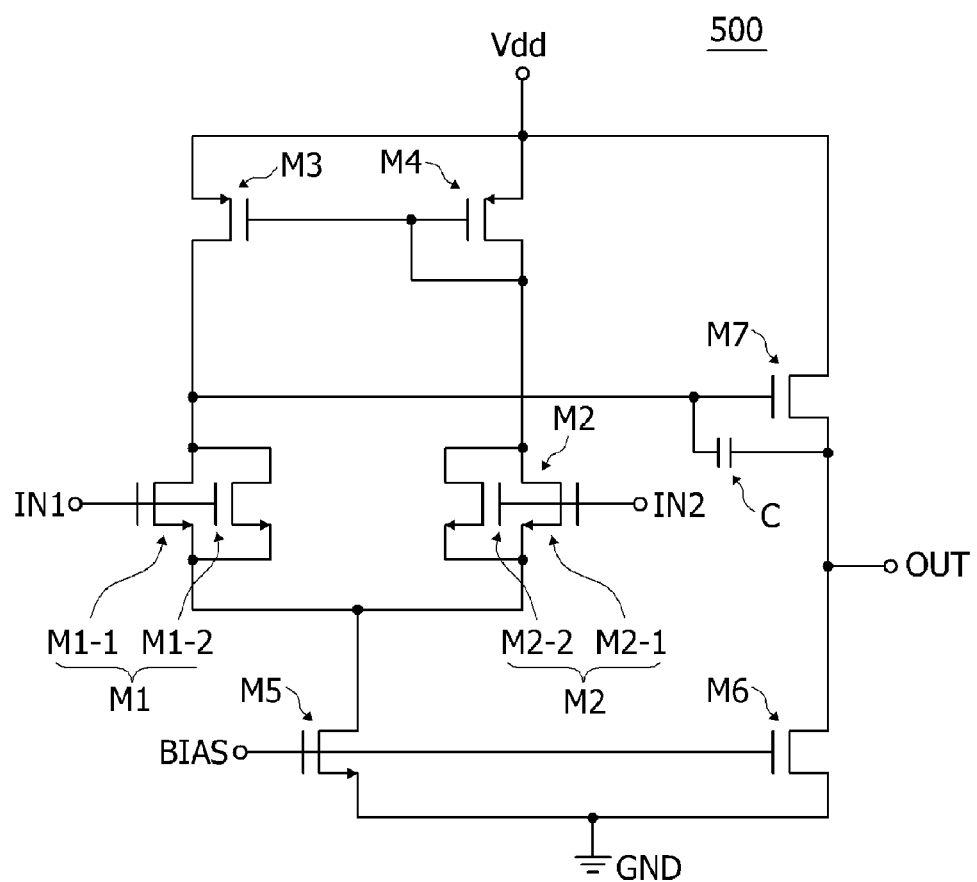
FIG. 11 is a circuit diagram illustrating an electronic device including MOS transistors according to an embodiment of the present disclosure.

FIG. 11 is a circuit diagram illustrating an electronic device 500 including MOS transistors according to an embodiment of the present disclosure. The circuit diagram illustrated in FIG. 11 has a similar configuration to the circuit diagram illustrated in FIG. 6. Thus, to avoid duplicate explanation, descriptions of the same elements as set forth in the embodiment illustrated in FIG. 6 will be omitted or briefly mentioned in this embodiment.

The electronic device 500 includes a first MOS transistor circuit M1 and a second MOS transistor circuit M2 that function as input circuits, and each of the first and second MOS transistor circuits M1 and M2 may include a plurality of MOS transistors. In an embodiment, the first MOS transistor circuit M1 includes a couple of first MOS transistors M1-1 and M1-2 which are connected in parallel. The couple of first MOS transistors M1-1 and M1-2 may be N-channel MOS transistors. A gate electrode, a drain terminal, and a source terminal of the first MOS transistor M1-1 are electrically coupled to a gate electrode, a drain terminal, and a source terminal of the first MOS transistor M1-2, respectively. Thus, an operation of the first MOS transistor M1-1 is synchronized with an operation of the first MOS transistor M1-2. Similarly, the second MOS transistor circuit M2 includes a couple of second MOS transistors M2-1 and M2-2 which are connected in parallel. The couple of second MOS transistors M2-1 and M2-2 may be N-channel MOS transistors. A gate electrode, a drain terminal, and a source terminal of the second MOS transistor M2-1 are electrically coupled to a gate electrode, a drain terminal, and a source terminal of the second MOS transistor M2-2, respectively. Thus, an operation of the second MOS transistor M2-1 is synchronized with an operation of the second MOS transistor M2-2.

Figure 12:
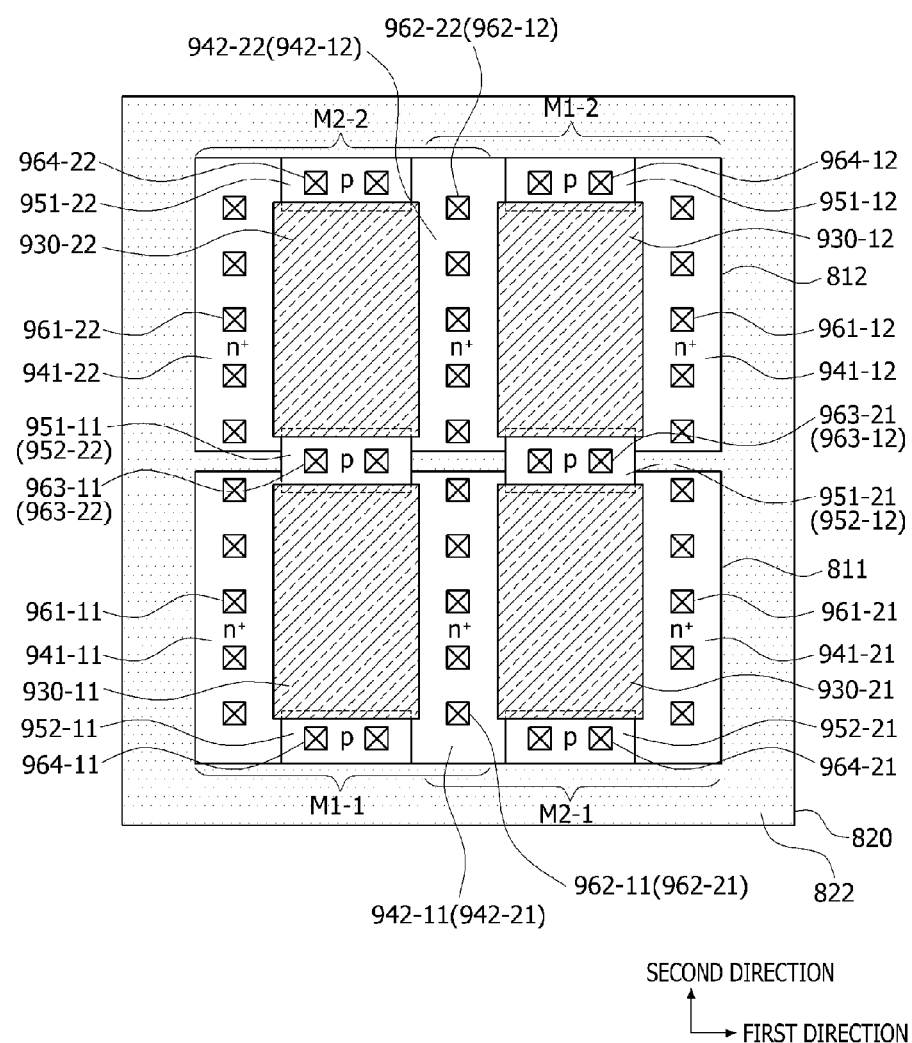
FIG. 12 is a layout diagram illustrating a first MOS transistor and a second MOS transistor included in the electronic device of FIG. 11 according to an embodiment of the present disclosure.

FIG. 12 is a layout diagram illustrating the first and second MOS transistor circuits M1 and M2 included in the electronic device 500 of FIG. 11 according to an embodiment. In the present embodiment, the first MOS transistors M1-1 and M1-2 constituting the first MOS transistor M1 are disposed in a first active region 811 and a second active region 812, which are spaced apart from each other along a second direction, respectively. The first MOS transistor M1-1 is disposed in a left-sided half region of the first active region 811 in a first direction, and the first MOS transistor M1-2 is disposed in a right-sided half region of the second active region 812 in the first direction. Thus, the first MOS transistors M1-1 and M1-2 are point symmetric with respect to a central point located between the first and second active regions 811 and 812. Similarly, the second MOS transistors M2-1 and M2-2 constituting the second MOS transistor M2 are disposed in the first active region 811 and the second active region 812, respectively. With respect to the orientation of FIG. 12, the second MOS transistor M2-1 is disposed in a right-sided region in the first active region 811, and the second MOS transistor M2-2 is disposed on a left-sided region in the second active region 812. Thus, the second MOS transistors M2-1 and M2-2 are also point symmetric with respect to a central point located between the first and second active regions 811 and 812. As a result, the first MOS transistor M1-1 and the second MOS transistor M2-1 are disposed in the first active region 811, and the second MOS transistor M1-2 and the second MOS transistor M2-2 are disposed in the second active region 812. Accordingly, a mismatching characteristic between the first and second MOS transistor circuits M1 and M2 may be improved because each of the first MOS transistors M1-1 and M1-2 and the second MOS transistors M2-1 and M2-2 are point symmetric and because each of the first MOS transistors M1-1 and M1-2 and a corresponding one of the second MOS transistors M2-1 and M2-2 are disposed in the same active region.

The first and second active regions 811 and 812 are defined by an isolation layer 822 disposed in an isolation region 820. The isolation region 820 is disposed to surround the first and second active regions 811 and 812 in a plan view. Although not indicated in FIG. 12, the first and second active regions 811 and 812 may have a P-type conductivity.

Although FIG. 12 illustrates an embodiment that each of the first and second active regions 811 and 812 has a rectangular shape in a plan view, embodiments are not limited thereto. In another embodiment, at least one of the first and second active regions 811 and 812 has a different shape from the rectangular shape. Each of the first and second active regions 811 and 812 may have a flat top surface which is parallel with a horizontal surface. The isolation layer 822 may be a trench isolation layer. Although not shown in the drawings, a step difference may exist between top surfaces of the active regions 811 and 812 and a top surface of the isolation layer 822. For example, a step difference between the top surface of the first active region 811 and the top surface of the isolation layer 822 may be different from a step difference between the top surface of the second active region 812 and the top surface of the isolation layer 822 because of the non-uniformity of fabrication processes.

The first MOS transistor M1-1 disposed in the first active region 811 includes a gate electrode 930-11, an N-type drain region 941-11, an N-type source region 942-11, a first P-type blocking region 951-11, and a second P-type blocking region 952-11. The gate electrode 930-11 is disposed on a portion of the first active region 811 without overlapping with the isolation region 820 in which the isolation layer 822 is disposed. Although not shown in FIG. 12, a gate insulation layer pattern may be disposed between the first active region 811 and the gate electrode 930-11. Further, the gate electrode 930-11 may be electrically coupled to a gate electrode 930-12 of the first MOS transistor M1-2 disposed on the second active region 812 through an interconnection line. The N-type drain region 941-11 is disposed in an upper portion of the first active region 811 between one end of the gate electrode 930-11 in the first direction and the isolation region 820 adjacent to the one end of the gate electrode 930-11. The N-type source region 942-11 is disposed in an upper portion of the first active region 811 which is adjacent to the other end of the gate electrode 930-11 in the first direction. As illustrated in FIG. 11, the N-type source region 942-11 of the first MOS transistor M1-1 is electrically coupled to a source region of the second MOS transistor M2-1. That is, the first and second MOS transistors M1-1 and M2-1 may share a single source region. Thus, the N-type source region 942-11 of the first MOS transistor M1-1 may also act as an N-type source region 942-21 of the second MOS transistor M2-1.

The first P-type blocking region 951-11 of the first MOS transistor M1-1 is disposed in an upper portion of the first active region and 811 between the second active region 812 adjacent to one end of the gate electrode 930-11 and the one end of the gate electrode 930-11 in the second direction. The second P-type blocking region 952-11 is disposed in an upper portion of the first active region 811 and between the other end of the gate electrode 930-11 in the second direction and the isolation region 820 adjacent to the other end of the gate electrode 930-11. The first and second blocking regions 951-11 and 952-11 may have the same conductivity type, e.g., a P-type, as that of the first active region 811. Thus, a drain current of the first MOS transistor M1-1 can flow from the N-type drain region 941-11 toward the N-type source region 942-11 only through an inverted channel region under the gate electrode 930-11 because both the first and second P-type blocking regions 951-11 and 952-11 disposed between the N-type drain region 941-11 and the N-type source region 942-11 have the same conductivity type as that of the first active region 811.

Drain electrodes 961-11 are disposed on the N-type drain region 941-11, and source electrodes 962-11 are disposed on the N-type source region 942-11. Although not shown in FIG. 12, the drain electrodes 961-11 may be electrically coupled to drain electrodes 961-12 of the first MOS transistor M1-2 disposed on the second active region 812 through an interconnection line, and the source electrodes 962-11 may be electrically coupled to source electrodes 962-12 of the first MOS transistor M1-2 disposed on the second active region 812 through an interconnection line.

If the first MOS transistor M1-1 operates when the first and second P-type blocking regions 951-11 and 952-11 are electrically floated, leakage currents may flows between the N-type drain region 941-11 and the N-type source region 942-11 because electric potentials of the first and second P-type blocking regions 951-11 and 952-11 are unstable. Thus, a certain bias voltage should be applied to the first and second P-type blocking regions 951-11 and 952-11 so that the first MOS transistor M1-1 stably operates. In order to apply an appropriate bias voltage to the first and second blocking regions 951-11 and 952-11, first contacts 963-11 and second contacts 964-11 are disposed on the first P-type blocking region 951-11 and the second P-type blocking region 952-11, respectively. Each of the first and second contacts 963-11 and 964-11 may include a metal layer.

If the first MOS transistor M1-1 is an N-channel MOS transistor, the bias voltage applied to the first and second P-type blocking regions 951-11 and 952-11 through the first and second contacts 963-11 and 964-11 may be set to be lower than a source voltage applied to the N-type source region 942-11. That is, a reverse bias is applied to a P-N junction between each of the first and second P-type blocking regions 951-11 and 952-11 and each of the N-type drain and source regions 941-11 and 942-11. In another embodiment, the bias voltage applied to the first and second P-type blocking regions 951-11 and 952-11 through the first and second contacts 963-11 and 964-11 may be set to be equal to the source voltage applied to the N-type source region 942-11.

The second MOS transistor M2-1 disposed in the first active region 811 includes a gate electrode 930-21, an N-type drain region 941-21, an N-type source region 942-21, a first P-type blocking region 951-21, and a second P-type blocking region 952-21. The gate electrode 930-21 is disposed on another portion of the first active region 811 without overlapping with the isolation region 820 in which the isolation layer 822 is disposed. The gate electrode 930-21 is disposed to be spaced apart from the gate electrode 930-11 of the first MOS transistor M1-1 along the first direction. Although not shown in FIG. 12, a gate insulation layer pattern may be disposed between the first active region 811 and the gate electrode 930-21. Further, the gate electrode 930-21 may be electrically coupled to a gate electrode 930-22 of the second MOS transistor M2-2 disposed on the second active region 812 through an interconnection line. The N-type drain region 941-21 is disposed in an upper portion of the first active region 811 and between one end of the gate electrode 930-21 in the first direction and the isolation region 820 adjacent to the one end of the gate electrode 930-21. The N-type source region 942-21 corresponds to the N-type source region 942-11.

The first P-type blocking region 951-21 is disposed in an upper portion of the first active region 811 and between one end of the gate electrode 930-2 in the second direction and the second active region 812 adjacent to the one end of the gate electrode 930-2. The second P-type blocking region 952-21 is disposed in an upper portion of the first active region 811 and between the other end of the gate electrode 930-11 in the second direction and the isolation region 820 adjacent to the other end of the gate electrode 930-2. The first and second blocking regions 951-21 and 952-21 may have the same conductivity type, e.g., a P-type, as that of the active region 811. Thus, a drain current of the second MOS transistor M2-1 can flow from the N-type drain region 941-21 toward the N-type source region 942-21 only through an inverted channel region under the gate electrode 930-21 because both the first and second P-type blocking regions 951-21 and 952-21 disposed between the N-type drain region 941-21 and the N-type source region 942-21 have the same conductivity type as that of the first active region 811.

Drain electrodes 961-21 are disposed on the N-type drain region 941-21, and source electrodes 962-21 are disposed on the N-type source region 942-21. Although not shown in FIG. 12, the drain electrodes 961-21 may be electrically coupled to drain electrodes 961-22 of the second MOS transistor M2-2 disposed on the second active region 812 through an interconnection line, and the source electrodes 962-21 may be electrically coupled to source electrodes 962-22 of the second MOS transistor M2-2 disposed on the second active region 812 through an interconnection line.

If the second MOS transistor M2-1 operates when the first and second P-type blocking regions 951-21 and 952-21 are electrically floated, leakage currents may flows between the N-type drain region 941-21 and the N-type source region 942-21 because electric potentials of the first and second P-type blocking regions 951-21 and 952-21 are unstable. Thus, a certain bias voltage should be applied to the first and second P-type blocking regions 951-21 and 952-21 in order that the second MOS transistor M2-1 stably operates. In order to apply an appropriate bias voltage to the first and second blocking regions 951-21 and 952-21, first contacts 963-21 and second contacts 964-21 are disposed on the first P-type blocking region 951-21 and the second P-type blocking region 952-21, respectively. Each of the first and second contacts 963-21 and 964-21 may include a metal layer.

If the second MOS transistor M2-1 is an N-channel MOS transistor, the bias voltage applied to the first and second P-type blocking regions 951-21 and 952-21 through the first and second contacts 963-21 and 964-21 may be set to be lower than a source voltage applied to the N-type source region 942-21. That is, a reverse bias is applied to a P-N junction between each of the first and second P-type blocking regions 951-21 and 952-21 and each of the N-type drain and source regions 941-21 and 942-21. In another embodiment, the bias voltage applied to the first and second P-type blocking regions 951-21 and 952-21 through the first and second contacts 963-21 and 964-21 may be set to be equal to the source voltage applied to the N-type source region 942-21.

As described above, the second MOS transistor M2-2 disposed in the second active region 812 and the second MOS transistor M2-1 disposed in the first active region 811 are point symmetric with respect to a central point located between the first and second active regions 811 and 812. Further, the second MOS transistor M2-2 and the first MOS transistor M1-1 are disposed to be symmetric with respect to a straight line extending along the first direction between the first and second active regions 811 and 812. The second MOS transistor M2-2 includes a gate electrode 930-22, an N-type drain region 941-22, an N-type source region 942-22, a first P-type blocking region 951-22, and a second P-type blocking region 952-22. The gate electrode 930-22 is disposed on a portion of the second active region 812 without overlapping with the isolation region 820 in which the isolation layer 822 is disposed. Although not shown in FIG. 12, a gate insulation layer pattern may be disposed between the second active region 812 and the gate electrode 930-22. The N-type drain region 941-22 is disposed in an upper portion of the second active region 812 and between one end of the gate electrode 930-22 in the first direction and the isolation region 820 adjacent to the one end of the gate electrode 930-22. The N-type source region 942-22 is disposed in an upper portion of the second active region 812 which is adjacent to the other end of the gate electrode 930-22 in the first direction. As illustrated in FIG. 11, the N-type source region 942-22 of the second MOS transistor M2-2 may be electrically coupled to a source region of the first MOS transistor M1-2. That is, the first and second MOS transistors M1-2 and M2-2 may share a single source region. Thus, the N-type source region 942-22 of the second MOS transistor M2-2 may act as an N-type source region 942-12 of the first MOS transistor M1-2.

The first P-type blocking region 951-22 is disposed in an upper portion of the second active region 812 and between one end of the gate electrode 930-22 in the second direction and the isolation region 820 adjacent to the one end of the gate electrode 930-22. The second P-type blocking region 952-22 is disposed in an upper portion of the second active region 812 and between the other end of the gate electrode 930-22 in the second direction and the first active region 811 adjacent to the other end of the gate electrode 930-22. The second P-type blocking region 952-22 may share the same region with the first P-type blocking region 951-11 of the first MOS transistor M1-1. However, in another embodiment, the first P-type blocking region 951-11 of the first MOS transistor M1-1 may be separated from the second P-type blocking region 952-22 of the second MOS transistor M2-2. In any case, a drain current of the second MOS transistor M2-2 can flow from the N-type drain region 941-22 toward the N-type source region 942-22 only through an inverted channel region under the gate electrode 930-22 because both the first and second P-type blocking regions 951-22 and 952-22 disposed between the N-type drain region 941-22 and the N-type source region 942-22 have the same conductivity type (e.g., a P-type) as that of the second active region 812. Drain electrodes 961-22 are disposed on the N-type drain region 941-22, and source electrodes 962-22 are disposed on the N-type source region 942-22.

If the second MOS transistor M2-2 operates when the first and second P-type blocking regions 951-22 and 952-22 are electrically floated, leakage currents may flows between the N-type drain region 941-22 and the N-type source region 942-22 because electric potentials of the first and second P-type blocking regions 951-22 and 952-22 are unstable. Thus, a certain bias voltage should be applied to the first and second P-type blocking regions 951-22 and 952-22 in order that the second MOS transistor M2-2 stably operates. In order to apply an appropriate bias voltage to the first and second blocking regions 951-22 and 952-22, first contacts 964-22 and second contacts 963-22 are disposed on the first P-type blocking region 951-22 and the second P-type blocking region 952-22, respectively. Each of the first and second contacts 964-22 and 963-22 may include a metal layer.

If the second MOS transistor M2-2 is an N-channel MOS transistor, the bias voltage applied to the first and second P-type blocking regions 951-22 and 952-22 through the first and second contacts 964-22 and 963-22 may be set to be lower than a source voltage applied to the N-type source region 942-22. That is, a reverse bias is applied to a P-N junction between each of the first and second P-type blocking regions 951-22 and 952-22 and each of the N-type drain and source regions 941-22 and 942-22. In another embodiment, the bias voltage applied to the first and second P-type blocking regions 951-22 and 952-22 may be set to be equal to the source voltage applied to the N-type source region 942-22.

As described above, the first MOS transistor M1-2 disposed in the second active region 812 and the first MOS transistor M1-1 disposed in the first active region 811 are point symmetric with respect to the central point located between the first and second active regions 811 and 812. Further, the first MOS transistor M1-2 and the second MOS transistor M2-1 are disposed to be symmetric with respect to a straight line extending along the first direction between the first and second active regions 811 and 812. The first MOS transistor M1-2 includes a gate electrode 930-12, an N-type drain region 941-12, an N-type source region 942-12, a first P-type blocking region 951-12, and a second P-type blocking region 952-12.

The gate electrode 930-12 is disposed on another portion of the second active region 812 without overlapping with the isolation region 820 in which the isolation layer 822 is disposed. Although not shown in FIG. 12, a gate insulation layer pattern may be disposed between the second active region 812 and the gate electrode 930-12. The N-type drain region 941-12 is disposed in an upper portion of the second active region 812 and between one end of the gate electrode 930-12 in the first direction and the isolation region 820 adjacent to the one end of the gate electrode 930-12. The N-type source region 942-12 is disposed in an upper portion of the second active region 812 which is adjacent to the other end of the gate electrode 930-12 in the first direction. As illustrated in FIG. 11, the N-type source region 942-12 of the first MOS transistor M1-2 may be electrically connected to a source region of the second MOS transistor M2-2. That is, the first and second MOS transistors M1-2 and M2-2 may share a single source region. Thus, the N-type source region 942-12 of the first MOS transistor M1-2 may act as the N-type source region 942-22 of the second MOS transistor M2-2.

The first P-type blocking region 951-12 is disposed in an upper portion of the second active region 812 and between one end of the gate electrode 930-12 in the second direction and the isolation region 820 adjacent to the one end of the gate electrode 930-12. The second P-type blocking region 952-12 is disposed in an upper portion of the second active region 812 and between the other end of the gate electrode 930-12 in the second direction and the first active region 811 adjacent to the other end of the gate electrode 930-12. The second P-type blocking region 952-12 may share the same region with the first P-type blocking region 951-21 of the second MOS transistor M2-1. However, in another embodiment, the second P-type blocking region 952-12 of the first MOS transistor M1-2 may be separated from the first P-type blocking region 951-21 of the second MOS transistor M2-1. In any case, a drain current of the first MOS transistor M1-2 can flow from the N-type drain region 941-12 toward the N-type source region 942-12 only through an inverted channel region under the gate electrode 930-12 because both the first and second P-type blocking regions 951-12 and 952-12 disposed between the N-type drain region 941-12 and the N-type source region 942-12 have the same conductivity type (e.g., a P-type) as that of the second active region 812. Drain electrodes 961-12 are disposed on the N-type drain region 941-12, and source electrodes 962-12 are disposed on the N-type source region 942-12.

If the first MOS transistor M1-2 operates when the first and second P-type blocking regions 951-12 and 952-12 are electrically floated, leakage currents may flows between the N-type drain region 941-12 and the N-type source region 942-12 because electric potentials of the first and second P-type blocking regions 951-12 and 952-12 are unstable. Thus, a certain bias voltage should be applied to the first and second P-type blocking regions 951-12 and 952-12 in order that the first MOS transistor M1-2 stably operates. In order to apply an appropriate bias voltage to the first and second blocking regions 951-12 and 952-12, first contacts 964-12 and second contacts 963-12 are disposed on the first P-type blocking region 951-12 and the second P-type blocking region 952-12, respectively. Each of the first and second contacts 964-12 and 963-12 may include a metal layer.

If the first MOS transistor M1-2 is an N-channel MOS transistor, the bias voltage applied to the first and second P-type blocking regions 951-12 and 952-12 through the first and second contacts 964-12 and 963-12 may be set to be lower than a source voltage applied to the N-type source region 942-12. That is, a reverse bias is applied to a P-N junction between each of the first and second P-type blocking regions 951-12 and 952-12 and each of the N-type drain and source regions 941-12 and 942-12. In another embodiment, the bias voltage applied to the first and second P-type blocking regions 951-12 and 952-12 may be set to be equal to the source voltage applied to the N-type source region 942-12.

Figure 13:
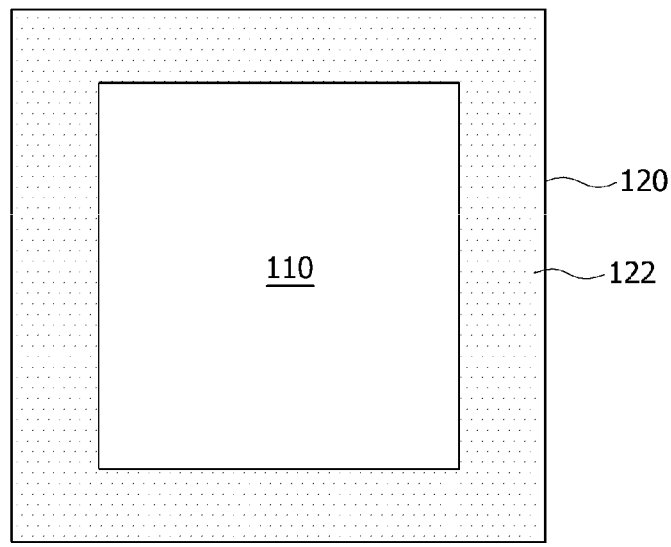
FIGS. 13 to 16 are layout diagrams illustrating a method of fabricating a MOS transistor according to an embodiment of the present disclosure.

FIGS. 13 to 16 are layout diagrams illustrating a method of fabricating a MOS transistor according to an embodiment of the present disclosure. Referring to FIG. 13, an isolation layer 122 is formed in an isolation region 120 to define an active region 110. The isolation layer 122 is formed to surround sidewalls of the active region 110. Although the present embodiment is described in conjunction with a single active region, embodiments are not limited thereto. That is, the isolation layer 122 may be formed to define a plurality of active regions which is separated from each other. In such a case, the plurality of active regions may have the same conductivity type or different conductivity types, as described with reference to FIG. 10 or 12. In an embodiment, the isolation layer 122 is formed using a trench isolation process.

Figure 14:
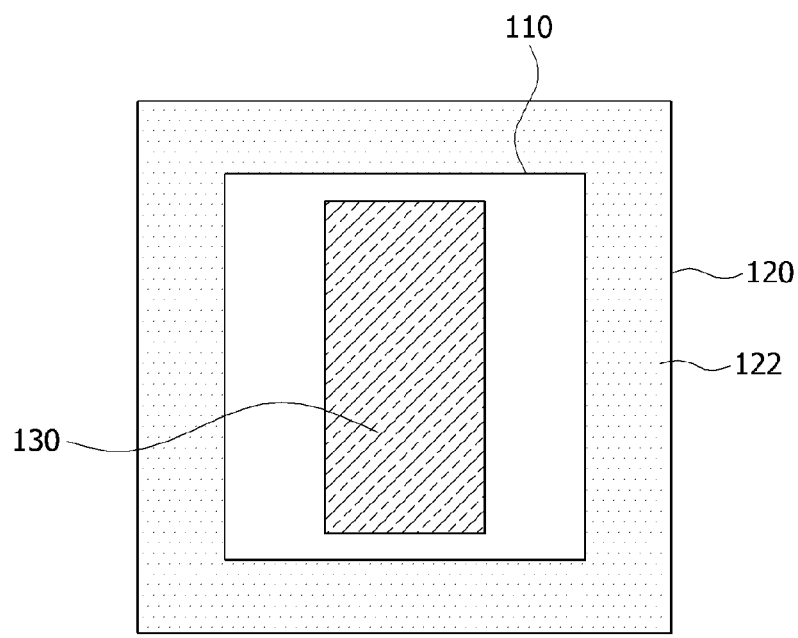

Referring to FIG. 14, a gate electrode 130 is formed on a portion of the active region 110. The gate electrode 130 is formed not to overlap with the isolation layer 122. More specifically, the gate electrode 130 is formed on the active region 110, and away from the edge or sidewall of the active region 110 that abuts the isolation layer 122 so that the gate electrode 130 is spaced apart from the isolation layer 122.

Although not shown in the drawings, a gate insulation layer pattern may be formed between the gate electrode 130 and the active region 110.

Figure 15:
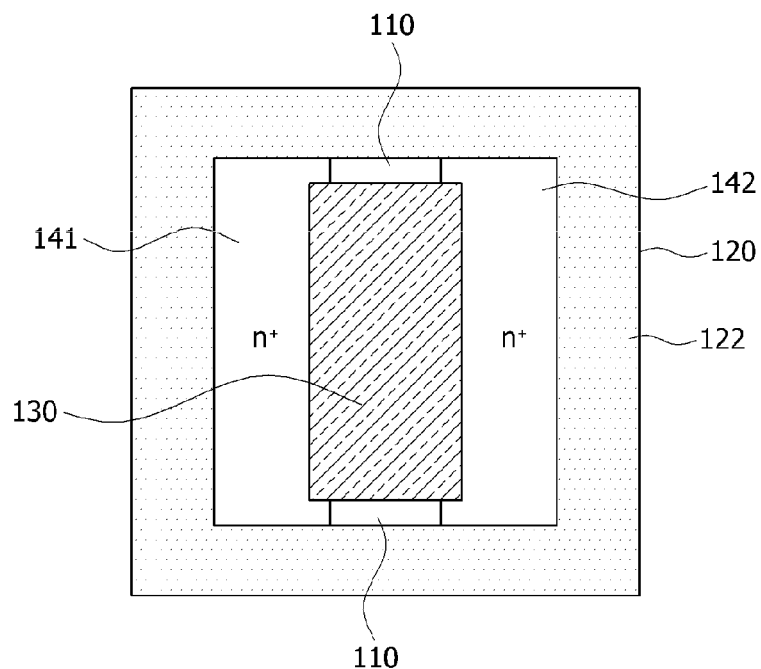

Referring to FIG. 15, N-type impurities are selectively implanted into portions of the active region 110, which are located at both sides of the gate electrode 130 in a first direction, to form an N-type drain region 141 and an N-type source region 142 which are opposite sides of the active region 110. A capping layer pattern (not shown) may be additionally formed on the gate electrode 130 before forming the N-type drain region 141 and the N-type source region 142.

In an embodiment, each of the N-type drain region 141 and the N-type source region 142 is formed to have a lightly doped drain (LDD) structure as described with reference to FIG. 4. In such a case, N-type impurities may be selectively implanted into portions of the active region 110, which are located at opposite sides of the gate electrode 130 along the first direction (e.g., a first side and a second side), to form a drain extension region and a source extension region having a relatively low concentration. Subsequently, spacers may be formed on sidewalls of the gate electrode 130 and N-type impurities may be selectively implanted into portions of the active region 110, which are located the first side and the second side of the gate electrode 130, to form a deep drain region and a deep source region that have a relatively high concentration.

In another embodiment, after the N-type drain region 141 and the N-type source region 142 are formed, top surfaces of the N-type drain region 141 and the N-type source region 142 may be exposed. A metal silicide layer may then be formed on the exposed top surfaces of at least the N-type drain region 141 and the N-type source region 142 using a silicidation process to reduce contact resistance of the N-type drain region 141 and the N-type source region 142 as described with reference to FIG. 5. In such a case, the silicidation process may be appropriately controlled such that no metal silicide layer is formed on the active region 110 between the N-type drain region 141 and the N-type source region 142.

Figure 16:
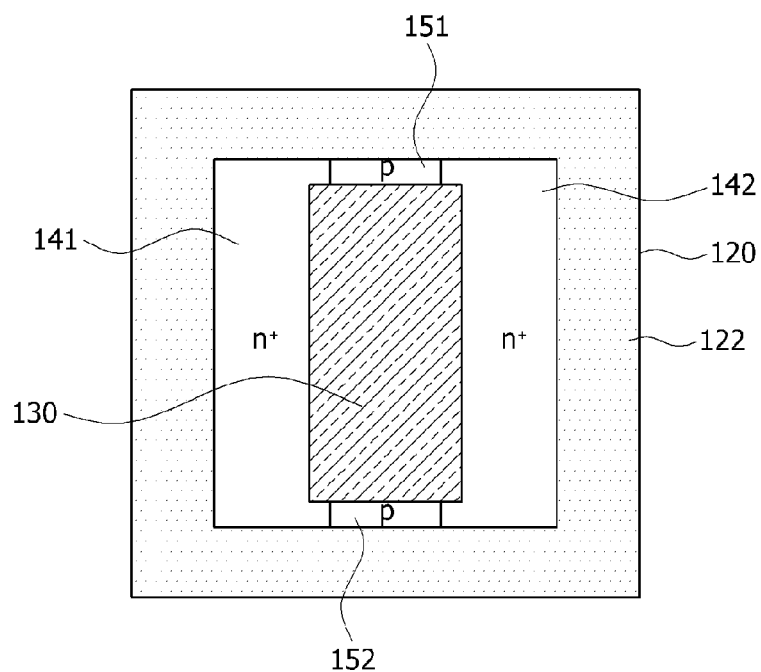

Referring to FIG. 16, P-type impurities are selectively implanted into exposed portions of the active region 110 between the N-type drain region 141 and the N-type source region 142, which are located at opposite sides of the gate electrode 130 along a second direction (e.g., a third side and a fourth side), which is perpendicular to the first direction, to form a first P-type blocking region 151 and a second P-type blocking region 152. Subsequently, as illustrated in FIG. 1, drain electrodes 161, source electrodes 162, first contacts 163, and second contacts 164 may be formed on the N-type drain region 141, the N-type source region 142, the first blocking region 151, and the second blocking region 152, respectively.

According to embodiments, gate electrodes of MOS transistors are disposed on active regions without overlapping with an isolation layer surrounding the active regions, and blocking regions are disposed in portions of the active regions which are located between source regions and drain regions of the MOS transistors and which are located between the gate electrodes and the isolation layer. The blocking regions have an opposite conductivity type to that of the source and drain regions. Thus, even though uneven surfaces are formed between the active regions and the isolation layer, the MOS transistors may exhibit uniform characteristics, for example, a uniform threshold voltage characteristic. Accordingly, the mismatching between the MOS transistors may be improved even though an offset removal circuit is not employed. That is, an offset value of the MOS transistors may be lowered without reducing the integration density of semiconductor devices.

Various embodiments have been disclosed above for illustrative purposes. Those skilled in the art will appreciate that various modifications, additions, and substitutions are possible, without departing from the scope and spirit of the inventive concept as disclosed in the accompanying claims.

What is claimed is:

1. A metal oxide semiconductor (MOS) transistor comprising:
   an active region including a channel region;
   a trench insulating isolation region disposed in a substrate and surrounding the active region to define the active region in the substrate;
   a gate electrode disposed over the active region without overlapping with the isolation region;
   a source region and a drain region disposed in first and second portions of the active region, respectively, the first and second portions being disposed at first and second sides of the gate electrode, respectively, the first side opposing the second side;
   a first blocking region disposed in a third portion of the active region and including a first portion disposed between a third side of the gate electrode and the isolation region and directly between the source region and the drain region in a plan view, the first portion being coplanar with the source and drain regions; and
   a second blocking region disposed in a fourth portion of the active region and including a second portion disposed between a fourth side of the gate electrode and the isolation region and directly between the source region and the drain region in a plan view, the fourth side opposing the third side, the second portion being coplanar with the source and drain regions,
   wherein the source region and the drain region have a first conductivity type and the first and second blocking regions have a second conductivity type opposite to the first conductivity type.

2. The MOS transistor of claim 1, further comprising a gate insulation layer disposed between the gate electrode and the channel region.

3. The MOS transistor of claim 1, further comprising:
   a drain electrode disposed over the drain region;
   a source electrode disposed over the source region;
   a first contact disposed over the first blocking region; and
   a second contact disposed over the second blocking region.

4. The MOS transistor of claim 1, wherein the first conductivity type is one of an N-type and a P-type and the second conductivity type is the other one of the N-type and the P-type.

5. The MOS transistor of claim 1, wherein an upper surface of the gate electrode has a plate form and is parallel with a top surface of the active region.

6. An electronic device including a plurality of MOS transistors, at least one of the plurality of MOS transistors comprising:
   an active region including a channel region;
   a trench insulating isolation region disposed in a substrate and surrounding the active region to define the active region in the substrate;
   a gate electrode disposed over the active region without overlapping with the isolation region;
   a source region and a drain region disposed in first and second portions of the active region, respectively, the first and second portions being disposed at first and second sides of the gate electrode, respectively, the first side of the gate electrode opposing the second side of the gate electrode;

a first blocking region disposed in a third portion of the active region and including a first portion disposed between a third side of the gate electrode and the isolation region and directly between the source region and the drain region in a plan view, the first portion being coplanar with the source and drain regions; and a second blocking region disposed in a fourth portion of the active region and including a second portion disposed between a fourth side of the gate electrode and the isolation region and directly between the source region and the drain region in a plan view, the fourth side of the gate electrode opposing the third side of the gate electrode, the second portion being coplanar with the source and drain regions, wherein the source region and the drain region have a first conductivity type and the first and second blocking regions have a second conductivity type opposite to the first conductivity type.

7. The electronic device of claim 6, further comprising a gate insulation layer disposed between the gate electrode and the channel region.

8. The electronic device of claim 6, further comprising:
a drain electrode disposed over the drain region;
a source electrode disposed over the source region;
a first contact disposed over the first blocking region; and
a second contact disposed over the second blocking region.

9. The electronic device of claim 6, wherein the first conductivity type is one of an N-type and a P-type and the second conductivity type is the other one of the N-type and the P-type.

10. The electronic device of claim 6, wherein an upper surface of the gate electrode has a plate form and is parallel with a top surface of the active region.

11. The electronic device of claim 6,
wherein the plurality of MOS transistors comprises:
first and second MOS transistor circuits receiving first and second input signals; and
third and fourth MOS transistor circuits supplying currents to the first and second MOS transistors, respectively,
wherein the at least one of the plurality of MOS transistors comprises the first and second MOS transistor circuits,
wherein the first and second MOS transistor circuits include a differential amplifier, and
wherein the third and fourth MOS transistors include a current mirror circuit.

12. The electronic device of claim 11, wherein the first and second MOS transistor circuits share a single source region.

13. The electronic device of claim 11,
wherein the active region includes a first active region and a second active region which are separated from each other,
wherein the first MOS transistor circuit includes first and second MOS transistors which are disposed on respective ones of the first and second active regions,
wherein the second MOS transistor circuit includes third and fourth MOS transistors which are disposed on respective ones of the first and second active regions,
wherein the first and second MOS transistors are disposed to be point symmetric with respect to a central point between the first and second active regions; and
wherein the third and fourth MOS transistors are disposed to be point symmetric with respect to a central point between the first and second active regions.

14. The electronic device of claim 13, wherein a gate electrode, a drain region, and a source region of the first MOS transistor disposed in the first active region are electrically coupled to a gate electrode, a drain region, and a source region of the second MOS transistor disposed in the second active region, respectively.

15. The electronic device of claim 13, wherein a gate electrode, a drain region, and a source region of the third MOS transistor disposed in the first active region are electrically coupled to a gate electrode, a drain region, and a source region of the fourth MOS transistor disposed in the second active region, respectively.

* * * * *